United States Patent
Kaplan

(10) Patent No.: US 11,646,177 B2
(45) Date of Patent: May 9, 2023

(54) HIGH-POWER SOLID-STATE MICROWAVE GENERATOR FOR RF ENERGY APPLICATIONS

(71) Applicant: CELLENCOR, INC., Ankeny, IA (US)

(72) Inventor: Kenneth Kaplan, Ankeny, IA (US)

(73) Assignee: Precisepower, LLC, Glendale Heights, IL (US)

( * ) Notice: Subject to any disclaimer, the term of this patent is extended or adjusted under 35 U.S.C. 154(b) by 20 days.

(21) Appl. No.: 16/947,134

(22) Filed: Jul. 20, 2020

(65) Prior Publication Data

US 2020/0350141 A1    Nov. 5, 2020

Related U.S. Application Data

(62) Division of application No. 16/129,299, filed on Sep. 12, 2018, now Pat. No. 10,720,310.

(60) Provisional application No. 62/558,553, filed on Sep. 14, 2017.

(51) Int. Cl.
| | |
|---|---|
| H01J 37/32 | (2006.01) |
| H01J 37/24 | (2006.01) |
| H03F 3/19 | (2006.01) |
| H03F 3/21 | (2006.01) |
| H01J 37/244 | (2006.01) |
| H05B 6/68 | (2006.01) |
| H05B 6/70 | (2006.01) |

(52) U.S. Cl.
CPC ...... *H01J 37/32201* (2013.01); *H01J 37/244* (2013.01); *H01J 37/32311* (2013.01); *H03F 3/19* (2013.01); *H03F 3/21* (2013.01); *H05B 6/686* (2013.01); *H05B 6/705* (2013.01)

(58) Field of Classification Search
None
See application file for complete search history.

(56) References Cited

U.S. PATENT DOCUMENTS

| | | | |
|---|---|---|---|
| 4,196,332 A | 4/1980 | MacKay et al. | |
| 4,415,789 A | 11/1983 | Nobue et al. | |
| 5,081,425 A | 1/1992 | Jackson et al. | |
| 5,179,264 A | 1/1993 | Cuomo et al. | |
| 5,561,395 A | 10/1996 | Melton et al. | |
| (Continued) | | | |

FOREIGN PATENT DOCUMENTS

CN    101808458    *   8/2018    .............. G05D 23/19

OTHER PUBLICATIONS

York, Robert A., "Some Considerations for Optimal Efficiency and Low Noise in Large Power Combiners", IEEE Transactions on Microwave Theory and Techniques, vol. 49, Issue 8, pp. 1477-1482, Aug. 2001.

*Primary Examiner* — Dedei K Hammond
(74) *Attorney, Agent, or Firm* — McKee, Voorhees & Sease, PLC

(57) ABSTRACT

A microwave generating system includes a modular architecture which is configurable to provide power output from under 1-kilowatt to over 100-kilowatts. The various power levels are achieved by combining the RF outputs of multiple RF power amplifiers in a corporate structure. The system can be used on any ISM band. Each system component incorporates a dedicated embedded microcontroller for high performance real-time control response. The components are connected to a high speed digital data bus, and are commanded and supervised by a control program running on a host computer.

14 Claims, 9 Drawing Sheets

(56) References Cited

U.S. PATENT DOCUMENTS

| | | |
|---|---|---|
| 5,561,397 A | 10/1996 | Kumar et al. |
| 5,793,253 A | 8/1998 | Kumar et al. |
| 6,020,794 A | 2/2000 | Wilbur |
| 6,680,467 B1 | 1/2004 | Whipple, Jr. |
| 7,605,652 B2 | 10/2009 | Beaulaton et al. |
| 9,860,941 B2 | 1/2018 | Grandemenge et al. |
| 2009/0267669 A1 | 10/2009 | Kasai |
| 2011/0168695 A1 | 7/2011 | Okajima et al. |
| 2014/0097908 A1 | 4/2014 | Fisk, II et al. |
| 2016/0359460 A1 | 12/2016 | Garuti et al. |
| 2018/0146518 A1 * | 5/2018 | Ma ........................ H05B 6/686 |

* cited by examiner

| Frequency MHz | Power Preset | Measured Return Loss |
|---|---|---|
| 2400 | 2000 | 10 |
| 2401 | 2000 | 10 |
| 2402 | 2400 | 16 |
| 2403 | 2400 | 17 |
| 2404 | 4000 | 22 |
| 2405 | 4000 | 22 |
| 2406 | 6000 | 25 |
| ⋮ | | |
| 2496 | 5000 | 24 |
| 2497 | 2000 | 10 |
| 2498 | 1000 | 10 |
| 2499 | 0 | 7 |
| 2500 | 0 | 5 |

510 → Frequency MHz
520 → Power Preset
530 → Measured Return Loss
500 Band Map

FIG. 3

HIGH-POWER SOLID-STATE MICROWAVE GENERATOR FOR RF ENERGY APPLICATIONS

CROSS-REFERENCE TO RELATED APPLICATIONS

This application is a Divisional Application of U.S. Ser. No. 16/129,299, filed Sep. 12, 2018, which claims priority under 35 U.S.C. § 119 to provisional patent application U.S. Ser. No. 62/558,553, filed Sep. 14, 2017. All applications are herein incorporated by reference in their entirety, including without limitation, the specification, claims, and abstract, as well as any figures, tables, or drawings thereof.

FIELD OF THE INVENTION

The invention relates generally to the field of microwave systems. More particularly, but not exclusively, the invention relates to systems, methods, and/or apparatus for the generation, control, monitoring, and operation of high powered microwave generation utilizing solid state components.

BACKGROUND OF THE INVENTION

High-power microwave systems are used in many applications, including consumer, industrial, medical, and scientific sectors. In addition to the ubiquitous consumer microwave oven, high-power microwave systems are used to cook or thaw food products at an industrial scale, to dry many bulk organic and inorganic materials, to set resins in composite material, to create plasmas for semiconductor manufacturing, and many other industrial applications. Magnetron tubes have been used almost exclusively for over 50 years to generate high-power (from 1 to 100 kilowatts) microwave energy. Magnetrons are relatively efficient and cost-effective in conversion of line power to microwaves. On the other hand, industrial magnetrons have many disadvantages, such as: relatively short lifetimes (2000 to 6000 hours), high replacement cost; problematic reliability in continuous process applications; limited ability to control output power, limited or no possibility of modulation, being restricted to a fixed frequency, instability, including mode jumping, and use of dangerous very high voltages. Unlike some other higher power radio frequency (RF) applications, such as communications or broadcasting, high-power systems are usually continuous wave and no information is carried by the RF output. Most high-power microwave systems operate in the government allocated Industrial, Medical, and Scientific (ISM) bands. The bands most commonly used for microwave heating in the United States are 902-928 MHz ("L band") and 2,400 to 2,500 GHZ ("S-band"). Allocations vary in other regions of the world.

Recent advances in semiconductor technology have made it practical and economically feasible to construct high-power solid-state microwave generators to replace magnetrons in many applications. The benefits of frequency agility possible with solid state devices have been known for some time, see e.g., MacKay, et. Al., U.S. Pat. No. 4,196,332, and Nobue, et. Al., U.S. Pat. No. 4,415,789. Laterally diffused metal oxide semiconductor (LDMOS) and gallium nitride (GaN) transistors are well suited for this application. Currently, no single transistor can deliver the power of a high-power magnetron, so the needed power output is achieved by using multiple power amplifier transistors operated in parallel with their outputs combined to produce a single power output. Functional blocks of two, four, or more transistors can be further combined in a hierarchy to achieve a system with very high output power levels. Solid-state microwave generators are in fact amplifiers, so their output frequency, phase, and amplitude can be varied in any combination. This gives solid-state microwave generators many useful capabilities which are difficult or impossible to obtain from magnetrons.

The main use of a microwave RF energy system is to apply high-power microwaves to some type of material, which may be a solid, liquid, or gas. Microwaves provide a unique form of volumetric heating. Often, but not exclusively, the purpose is to heat the material to cook it or dry it. Other uses include generation of plasma arcs, excitation of catalysts, and acceleration of chemical reactions, among others. The material being processed is preferred to be enclosed in some type of chamber which is mainly made of aluminum, copper, or stainless steel. The container can have many forms including a large box, a tank, a pressure vessel, or even just waveguide. One or more feeds or antennas are used to apply microwave energy to the process material. Within the industry, the generic term used for the processing chamber is called an "applicator". Applicators are typically equipped with devices to move the material being processed, various sensors to monitor the process, and safety devices to prevent accidental exposure of microwave energy to people. The material being processed within the applicator is commonly called the "load". The microwave energy source is normally connected to the load using a transmission line of waveguide or coaxial cable.

As with any RF system, maximum energy is transferred when the generator, transmission line, and load have matched impedances. The impedances of the generator and transmission line are defined and effectively constant. The load impedance is a complex conjugate which includes the electromagnetic properties of the applicator structure, the shape, mass, position, and dielectric properties of the load. These may all interact with each other. Often the characteristics of the load, and therefore the applicator impedance, will vary significantly during system operation due to changing properties of the load material.

When there is an impedance mismatch, electromagnetic waves are reflected from the applicator through the transmission line back to the generator, and standing waves appear in the transmission line. There are several detrimental effects of standing waves. First, there is a loss of efficiency. The reflected power will be absorbed by the transmission line and/or the generator. This energy is lost as waste heat. The standing waves can result in high voltage which can cause arcs in the applicator or waveguide, or may damage the generator. A change in load impedance can also affect the stability and performance of the generator. The simplest and most common approach to protect the amplifier is to provide a method of detecting excessive reflected power and reducing the power output proportionally (for example, see Jackson, et. Al. U.S. Pat. No. 5,084,425). This technique may prevent damage to the amplifier but has the disadvantage of preventing full power output.

A circulator device is usually installed in line at the generator output to absorb and dissipate reflected power which protects the generator and provides constant impedance. In some cases, load mismatch problems are partially addressed using manual or automatic waveguide tuners. These generally comprise of two or more tuning rods that are extended into the waveguide. Manual tuners cannot adapt to rapid or recurring changes in the load impedance. Automatic tuners are relatively slow because they are basically mechanical devices driven by stepping motors and both types add significant cost and complexity to the system.

Another approach is system tuning by varying the wavelength of the microwave energy. The wavelength is directly proportional to frequency. This is not possible with magnetrons because they are inherently fixed frequency devices. However, solid-state microwave generators can be frequency agile and operate anywhere within the permitted ISM bands. When the microwave frequency is swept across the band, impedance changes of the load become apparent. Often there will be multiple frequencies or ranges of frequencies where a relatively good match may occur. The invention provides a means to dynamically identify optimal matching frequencies and automatically tune the microwave generator to those frequency ranges. As a result, less reflected energy is absorbed by circulators. This saves energy and reduces the cooling system's required capacity.

Another crucial factor is distribution of electromagnetic energy in the three dimensional space within the applicator. This is a very complex topic. The electromagnetic field distribution depends on the microwave wavelength, the geometry of the applicator, the location, phase and type of the feed(s), and many other factors. The applicator may be of a pseudo-resonant type, which is referred to as a "single mode applicator" because a single electromagnetic mode is dominant within the applicator. Typically, there is an organized and well-defined area of high energy. This is the most desirable location for the load for maximum energy adsorption. Most commonly used are the "multimode applicators" which are non-resonant and have a wide variety of waves of various modes scattered in a somewhat random pattern. There is constructive and destructive interference of waves having different modes and phase at various points within the three-dimensional space of the applicator. This gives rise to "hot spots" and "cold spots" within the applicator. Often, cooking, drying, and heating systems are equipped with devices to stir the waves such as rotating antennas, or turntables used to rotate the load as are commonly provided in consumer microwave ovens. Practical applicator design is difficult. Powerful electromagnetic simulation software can be used to model applicator design, but real-world performance is often significantly different, usually due to dynamic load variation.

When the operating frequency of a microwave generator is swept across the band, the phase and modes of the intersecting waves in the applicator move around. As a result, interference nodes of high and low energy change locations in the three-dimensional space of the applicator. This results in more uniform heating of material inside the applicator, often eliminating the need for mechanical wave stirrers or turntables with a resulting reduction in cost and complexity.

The preceding explains two important benefits of the frequency agility of solid-state microwave generators. However, to take advantage of this ability it is also necessary to have precise-power control over a very wide dynamic range, and have highly accurate means to measure the forward output power of the generators and the energy reflected from the load due to impedance mismatch. It is also necessary to have a control system capable of automatic management of frequency and power during the operation of the entire microwave system. The control system also needs to be easy to operate for its users.

SUMMARY OF THE INVENTION

Therefore, it is a principal object, feature, and/or advantage of the disclosed features to overcome the deficiencies in the art.

Aspects of the invention disclosed herein include a high-power solid-state microwave generator. The modular, multi-level corporate architecture permits configurations of various output power levels from under 1 kilowatt to 100 kilowatts or more. The various functional components of the system are controlled by embedded microcontrollers connected by an internal high-speed data bus directed by a master computer. This provides high speed real time response during operation. The system permits precise control of output power, phase, and frequency. A sophisticated and versatile frequency sweep and output impedance measurement capability allows the system to automatically and dynamically match to varying load impedances following a recipe represented in a Band Map table. The invention also provides an integral one port network analyzer function which can be utilized when the system is idle or running. Adaptive power control precisely adjusts power output to changing loads according to user-definable rules. A Band Map data structure is used to define the operation of sweep modes. A graphical user interface program provides the ability to create, edit, save, and load Band Maps. The system includes the ability to perform static and dynamic phase matching of functional RF units at multiple levels. A special mode is provided for microwave plasma excitation.

A technique for static and dynamic phase and amplitude balancing of a plurality of SSPAs (solid state power amplifiers) is also provided. The microwave generator system is able to deliver very high power levels by combining the RF output of multiple Power Amplifier Modules. This is done by connecting their outputs to an N-way power combiner. It is a characteristic of power combiners that maximum power output and minimum power loss occurs when all of the input are matched within a narrow range with respect to phase and amplitude, with phase matching being most critical. When a combined multi-amplifier system is operated, the actual phase relationships may change. In the short term, this is primarily due to heating of component and interconnecting cables. In the long term, is may be the result of component aging or replacement. The system can perform a matching cycle by comparing the total power output while adjusting the phase and amplitude to various combinations of Power Amplifier Modules (which can be enabled independently) until all are phase matched. Due to the utilization of extremely fast power detectors and power control attenuators, a phase matching cycle over the entire system can be executed in a period of milliseconds. When operating, the system can periodically (on the order of minutes or hours) can briefly suspend power generation and execute a matching cycle. The time required to do so is so short the effect on total energy delivered by the system is miniscule.

Additional aspects include dynamic frequency sweeping across an entire band, or selected portions of a band, with the ability to specify an output power level at each frequency interval and frequency hopping. The preset data values for frequency sweeping are stored in a Band Map, which is a data structure synchronously maintained in the memory of the Exciter Unit and the Host Computer. The table contains a number of entries representing equally spaced frequencies across the entire operating band. Each entry contains a value for an output power preset and the measured output return loss at the specific frequency. The Band Map is created and updated either manually by the user, or automatically on the Host Computer. A copy of the Band Map is maintained in the memory of the embedded microcontroller on the Exciter Unit, which updates in real time the return loss measurement values. The Host Computer executes a protocol which maintains coherency between its copy of the Band Map and the copy in the Exciter Unit in near real time. When the system is running it steps through the band from lower to higher frequencies at intervals corresponding to each band map entry. Each discrete frequency has a power preset value in the Band Map able. At the beginning of each step, the RF output power is set to a preset value from the table, and is held at that power level for the user-defined time. When the step time has expired, the system moves to the next higher frequency. If the power preset for the next step is zero, the system immediately skips to the next frequency that has a non-zero power preset. Ranges of frequencies with poor impedances or where the user does not want to use can be locked out by setting their power presets to zero. This results in frequency hopping. The sweep sequence repeats until the highest possible frequency is reached, and the sweep repeats again starting at the lowest frequency. Band Maps can be saved to and loaded from host computer files.

An Automatic Band Map Creation function for generating an optimized Band Map which will deliver maximum power to a load with varying impedance across the band is also provided. This function is executed by software running on a Host Computer. The system then commands a return loss scan, which fills the Band Map table with measured return loss data at each frequency interval. There are two user defined return loss thresholds. The first is an Absolute Return Loss limit. This represents the minimum tolerable return loss where excessive reflected power could damage or overheat the generator, transmission lines, the applicator, or cause arcing. The second is an Adaptive Return Loss Limit value to the level where the impedance match is relatively poor but not prohibitive. At frequencies with return loss below this limit, the power preset will be propositionally reduced to limit the absolute level of reflected power. When executed, at each frequency, the power preset will be set automatically according to these rules: a) Full preset power if the measured return loss is greater or equal to the Adaptive Return Loss Limit; b) zero power if the measured return loss is less than or equal to the Absolute Return Loss Limit so that frequency will be skipped; or c) If the measured return loss is less than the Adaptive Return Loss Limit and above the Absolute Return Loss Limit, the power preset at that frequency will reduced by a user defined dB power amount per dB of measured power below the Adaptive Return Loss Limit. As a result, when executed the Band Map will cause full power to be generated at all frequencies above the Adaptive Return Loss Limit, at proportionally reduced power at frequencies below the Adaptive Return Loss Limit, and no power will be generated at frequencies below the Absolute Return Loss Limit. The user software running on the Host Computer provides editing features that permit the user to adjust or fine tune an automatically created Band Map.

An Adaptive Power mode of operation were dynamic adjustment of power relative to a preset power level occurs while the system is generating RF power. The system therefore is able to safely deliver the maximum possible average power to the load over a range of frequencies over time even as the impedance of the load changes significantly. This function is executed in real time by firmware running on the embedded microcontroller in the exciter unit. At the beginning of each frequency step during a sweeping operation, the Exciter Unit changes the frequency of the digital frequency synthesizer to the new frequency. Next, the microcontroller reads the system's forward and reflected output power and calculates the instantaneous return loss value, which is compared to the Adaptive Return Loss and the Absolute Return Loss limit settings. It then adjusts the power preset value obtained from the Band Map table as follows: a) the full preset power is set if the measured return loss is greater or equal to the Adaptive Return Loss Limit; b) zero power is set and the current frequency step is terminated if the measured return loss is less than or equal to the Absolute Return Loss Limit; or c) If the measured return loss is less than the Adaptive Return Loss Limit and above the Absolute Return Loss Limit, the power preset at that frequency will reduced by a user defined dB power amount per dB of measured power below the Adaptive Return Loss Limit. As a result, full power to be generated at all frequencies above the Adaptive Return Loss Limit, at proportionally reduced power at frequencies below the Adaptive Return Loss Limit and no power will be generated at frequencies below the Absolute Return Loss Limit. This feature can also be used in single frequency operation.

According to additional aspects, an integral single port network scalar analyzer function includes two operating modes:

a) a static Network Analyzer function in which the Host Computer commands the Exciter unit to perform a low power frequency sweep across the entire band at each frequency corresponding to each entry in the Band Map. The return loss at each frequency is stored in the Band Map table. The return loss data is plotted on the user interface Band Display, which provides the functionality of a one port network analyzer. The system can execute a single or continuous sweeps. The network analysis is of great value to the user: for creation of a band map, manually or automatically, capable of maximum power delivery to a load with varying load impedance across the band; for testing the transmission lines and applicator; and for manually adjusting the applicator loads or tuning.

b) a dynamic Network Analyzer function active when the system is operating, where the Exciter Unit transmits near real-time return loss data to the Host Computer, which then plots the data on the Band Display. This provides to the user a near real time picture of the load impedance versus frequency, which may vary considerably over time as power is applied to the load due to changes in temperature, position, mass, moisture content, etc.

Additional aspects of the invention include an Adaptive Power mode of operation where dynamic adjustment of power relative to a preset power level occurs while the system is generating RF power. The system therefore is able to safely deliver the maximum possible average power to the load over a range of frequencies over time even as the impedance of the load changes significantly. This function is executed in real time by firmware running on the embedded microcontroller in the exciter unit. At the beginning of each frequency step during a sweeping operation, the Exciter Unit changes the frequency of the digital frequency synthesizer to the new frequency. Next, the microcontroller reads the system's forward and reflected output power and calculates the instantaneous return loss value, which is compared to the Adaptive Return Loss and the Absolute Return Loss limit settings. It then adjusts the power preset value obtained from the Band Map table as follows: a) the full preset power is set if the measured return loss is greater or equal to the Adaptive Return Loss Limit; b) zero power is set and the current frequency step is terminated if the measured return loss is less than or equal to the Absolute Return Loss Limit; or c) If the measured return loss is less than the Adaptive Return Loss Limit and above the Absolute Return Loss Limit, the power preset at that frequency will reduced by a user defined dB power amount per dB of measured power below the Adaptive Return Loss Limit. As a result, full power to be generated at all frequencies above the Adaptive Return Loss Limit, at proportionally reduced power at frequencies below the Adaptive Return Loss Limit and no power will be generated at frequencies below the Absolute Return Loss Limit. This feature can also be used in single frequency operation.

Still further aspects include a plasma exciter function for driving plasma generators, which provides a discrete higher power ignition pulse immediately followed by a lower power maintenance level, and the option of pulse width modulation of either or both.

Also disclosed is a method for automatic gain matching and balancing of the RF power transistors within the Power Amplifier Modules by means of real-time monitoring of drain current and the temperature of each transistor, and adjusting the gate bias proportionally.

According to additional aspects of the invention, Solid State Power Amplifier (SSPA) Modules each incorporate: a number of solid state power amplifier power pallets operating in parallel; high speed/high resolution forward and reverse power detectors, wide dynamic range programmable RF attenuators; programmable phase shifters, and a high performance embedded microcontroller, all interconnected to an intra-module high speed digital data bus. The microcontroller controls and monitors the power amplifier pallets containing the RF power amplifier transistors, including managing gate bias and temperature compensation. The microcontroller also monitors the drain voltage and current of the transistors to protect them from abnormal conditions. An MPAC monolithic digital phase shifter and attenuator in the RF path allows the unit to adjust the output phase and power level so that multiple Power Amplifiers in a corporate structure can be tuned for maximum system power combiner performance. Power Amplifier Modules receive and execute control commands and returns operational data to a master control computer over a system-wide high speed digital data bus.

An Exciter Unit provides a master drive RF signal via an N-way RF divider and is distributed in common phase to the power amplifier modules. The drive signal controls the frequency, phase, and baseline power output level of the SSPAs. The drive signal also performs gain leveling as the output power level and operating frequency changes. The Exciter Unit comprises: a digital frequency synthesizer; high speed/high resolution forward and reverse power detectors connected to a directional coupler located on the main system RF output; wide dynamic range programmable coarse and fine range RF attenuators, programmable phase shifters, and a high performance embedded microcontroller, all interconnected to an intra-module high speed digital data bus. The microcontroller executes autonomously in real-time algorithms capable of single frequency or selective frequency sweeping, output forward power, reflected power and return loss measurements, adaptive power control, output power measurement, and phase adjustment while the system is generating RF power output. The Exciter Unit receives and executes control commands and returns operational data to a master control computer over a system-wide high speed digital data bus.

A Host Computer executes a program that provides an interactive user interface and directs the overall system operation by sending commands and receiving operating system to and from the Exciter Unit, the power amplifier modules, and other subsystem over system-wide high-speed digital data bus.

These and/or other objects, features, and advantages of the disclosure will be apparent to those skilled in the art. The present invention is not to be limited to or by these objects, features and advantages. No single embodiment need provide each and every object, feature, or advantage.

BRIEF DESCRIPTION OF THE DRAWINGS

FIG. 3 is an exemplary Band Map internal data structure for use with the disclosed.

Figure 1:
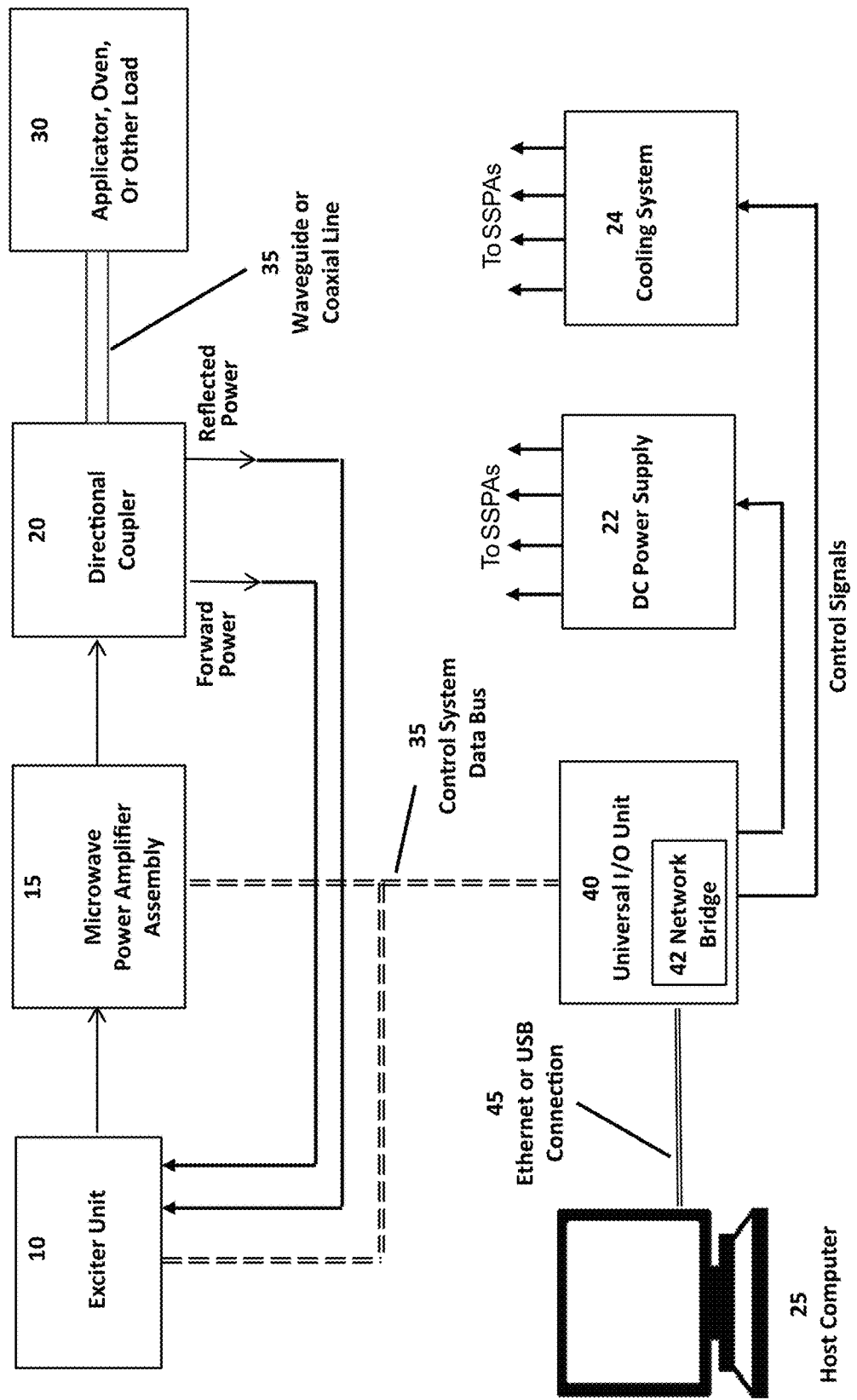
FIG. 1 is a schematic of architecture of a solid-state microwave generator system according to at least some aspects of the invention.

Various embodiments of a system and related components are described in detail with reference to the drawings, wherein like reference numerals represent like parts throughout the several views. Reference to various embodiments does not limit the scope of the invention. Figures represented herein are not limitations to the various embodiments according to the invention and are presented for exemplary illustration of the invention.

DETAILED DESCRIPTION OF THE PREFERRED EMBODIMENTS

The following definitions and introductory matters are provided to facilitate an understanding of the present invention. Unless defined otherwise, all technical and scientific terms used herein have the same meaning as commonly understood by one of ordinary skill in the art to which embodiments of the present invention pertain.

The terms "a," "an," and "the" include plural referents unless context clearly indicates otherwise. Similarly, the word "or" is intended to include "and" unless context clearly indicate otherwise. The word "or" means any one member of a particular list and also includes any combination of members of that list.

The terms "invention" or "present invention" as used herein are not intended to refer to any single embodiment of the particular invention but encompass all possible embodiments as described in the specification and the claims.

The term "about" as used herein refers to variation in the numerical quantities that can occur, for example, through typical measuring techniques and equipment, with respect to any quantifiable variable, including, but not limited to, mass, volume, time, distance, wave length, frequency, voltage, current, and electromagnetic field. Further, given solid and liquid handling procedures used in the real world, there is certain inadvertent error and variation that is likely through differences in the manufacture, source, or purity of the ingredients used to make the compositions or carry out the methods and the like. The claims include equivalents to the quantities whether or not modified by the term "about."

The term "configured" describes an apparatus, system, or other structure that is constructed or configured to perform a particular task or to adopt a particular configuration. The term "configured" can be used interchangeably with other similar phrases such as constructed, arranged, adapted, manufactured, and the like.

Terms such as first, second, vertical, horizontal, top, bottom, upper, lower, front, rear, end, sides, concave, convex, and the like, are referenced according to the views presented. These terms are used only for purposes of description and are not limiting. Orientation of an object or a combination of objects may change without departing from the scope of the invention.

The apparatuses, systems, and methods of the present invention may comprise, consist essentially of, or consist of the components of the present invention described herein. The term "consisting essentially of" means that the apparatuses, systems, and methods may include additional components or steps, but only if the additional components or steps do not materially alter the basic and novel characteristics of the claimed apparatuses, systems, and methods.

The following embodiments are described in sufficient detail to enable those skilled in the art to practice the invention however other embodiments may be utilized. Mechanical, procedural, and other changes may be made without departing from the spirit and scope of the invention. Accordingly, the scope of the invention is defined only by the appended claims, along with the full scope of equivalents to which such claims are entitled.

The basic architecture of a solid-state microwave generator is shown in FIG. 1. The microwave generator has many subsystems. The architecture is unique in that real-time control and processing is localized in various functional units, each having a dedicated microcontroller. These are interconnected within the generator assembly by a high-speed local network (35). This network is designed to be resistant to RF interference using hardware and software techniques. To achieve high power output, a large number of power transistors are operated in parallel. There is considerable processing overhead in managing their operation with respect to output power control, active biasing, temperature compensation, over-temperature monitoring, and drain current monitoring. Devolving these tasks to local embedded microcontrollers reduces complexity, cost, and enhances overall system performance. This architecture is highly modular which easily allows for configuration of various system sizes and power output levels. Another benefit is fault tolerance. If one or more of the power amplifier modules fails, the system can continue to produce power if not at full capacity, or at reduce power if at full capacity.

The RF chain in general will be familiar to those knowledgeable in the design of RF power amplifiers of the type used in broadcast transmitters, cellular base stations, and two-way radio systems. An Exciter Unit (10) provides a low-level continuous wave (CW) or pulse-modulated signal. Its output controls the generator's frequency, phase, and power output. Unlike most other RF transmitter applications, RF energy systems are not modulated to carry any type of information. This allows a beneficial tradeoff of less linearity in exchange for greater efficiency and power output. The present disclosure describes an exciter system that provides several novel and useful capabilities when used as part of a high-power solid-state microwave generator.

The exciter drives one or more microwave power amplifier units (15). It is typically multistage and uses multiple power transistors such as LDMOS or GaN types operating in parallel with outputs combined in one or more levels. The gain of the power amplifier is typically 50 dB to 70 dB, providing a continuous wave power output ranging from one to over 100 kilowatts. The output of the amplifier unit passes through a directional coupler (20) which samples the forward power being delivered to the load and power being reflected from the load due to impedance mismatch. The forward and reflected power samples are routed to the Exciter Unit (10) which has detectors that convert the RF levels to digital values. Highly accurate measurement of these samples permits the exciter unit to provide precise-power control, to respond to varying load mismatch conditions. This is advantageous for the adaptive power control functions. The power output of the amplifier is conducted to the system's load (30), (i.e. the applicator), via a waveguide or coaxial transmission line (35). The generator also has other important functional units including power supplies (22), a processing unit, e.g., a Host Computer (25), a cooling system (24), etc.

It will be appreciated that the Host Computer (25) can be generally any unit including, but not limited to, processing units (e.g., a processor, a microprocessor, a microcontroller, central processing unit (CPU), arithmetic logic unit (ALU)) computers, servers, tablets, phones, handhelds, etc. The processor can be connected to a user display or user interface, such as a GUI, to allow for viewing of information. The input from the user interface ("UI") can be sent to a microcontroller to control operational aspects of a device and could include a combination of digital and analog input and/or output devices or any other type of UI input/output device required to achieve a desired level of control and monitoring for a device. A user interface is how the user interacts with a machine, and could be a digital interface, a command-line interface, a graphical user interface ("GUI") or any other way a user can interact with a machine. For example, the user interface module can include a display and input devices such as a touch-screen, knobs, dials, switches, buttons, etc. More specifically, the display could be a liquid crystal display ("LCD"), a light-emitting diode ("LED") display, an organic LED ("OLED") display, an electroluminescent display ("ELD"), a surface-conduction electron emitter display ("SED"), a field-emission display ("FED"), a thin-film transistor ("TFT") LCD, a bistable cholesteric reflective display (i.e., e-paper), etc. The device can also include a human-machine interface to allow for the transmission of information or settings between a user and the machine.

The Exciter Unit

The microwave generator's operating frequency, phase, modulation, and power output is established by the Exciter Unit (10). Central to the Exciter Unit (10) is a high-speed embedded microcontroller (140). As its performance greatly affects the performance and response time of the system, it is preferably capable of execution of a minimum of 70 million instructions per second. The microcontroller is completely dedicated to real-time execution of the adaptive power control and frequency sweeping program, so it is unburdened by other "housekeeping" functions. The microcontroller contains an internal flash program memory (144), as well as read/write memory (144) for data.

The memory includes, in some embodiments, a program storage area and a data storage area. The program storage area and the data storage area can include combinations of different types of memory, such as read-only memory ("ROM", an example of non-volatile memory, meaning it does not lose data when it is not connected to a power source), random access memory ("RAM", an example of volatile memory, meaning it will lose its data when not connected to a power source) Some examples of volatile memory include static RAM ("SRAM"), dynamic RAM ("DRAM"), synchronous DRAM ("SDRAM"), etc. Examples of non-volatile memory include electrically erasable programmable read only memory ("EEPROM"), flash memory, a hard disk, an SD card, etc. In some embodiments, the processing unit, such as a processor, a microprocessor, or a microcontroller, is connected to the memory and executes software instructions that are capable of being stored in a RAM of the memory (e.g., during execution), a ROM of the memory (e.g., on a generally permanent basis), or another non-transitory computer readable medium such as another memory or a disc.

The microcontroller sends and receives data from several devices within the Exciter Unit (10). Most of these devices are integrated circuits which communicate with the microprocessor via a standard Serial Peripheral Interface (SPI) bus. In the interest of performance, the high-speed digital I/O bus (105) within the Exciter Unit (10) operates at a minimum speed of 10 megabits per second. Alternatively, other comparable high speed digital buses can be used.

The RF chain within the Exciter Unit (10) is comprised of a digital frequency synthesizer (100), an RF source switch (118), a phase shifter (112), and a programmable attenuator block comprising a digital attenuator (120), and an analog attenuator (124). The output of this RF chain drives the power amplifier.

An RF frequency synthesizer circuit (100) establishes the operating frequency as specified by the microcontroller (140). Many such devices are commercially available. An example is the ADF4351 manufactured by Analog Devices, Inc. which can generate an RF output over a very wide range from 35 MHz to 4.4 GHz. It internally comprises a voltage controlled oscillator (VCO), a digital divider chain, and a phase detector. The phase detector controls the VCO frequency by comparing its divided-down output to an external crystal controlled reference oscillator (110). The operating frequency depends on the division ratio, which is transferred into the synthesizer IC from an external microcontroller (140). The output of the synthesizer is a constant amplitude low-level output, in the case of the AD4351, of about one milliwatt (0 dBm). The output of the synthesizer is also provided to an external connector (112) for use for phase matching with other generators.

The next device in the RF chain is a source switch (118). The source switch comprises switches that are used to select between the synthesizer output, or a signal source from an external input connector (112). The external input can be used in applications where it is useful to control the relative phase of multiple microwave generators. Example applications include, but are not limited to:1) combining the outputs of multiple generators where the phase and amplitude of each generator is matched to achieve full power output (FIG. 4); and 2) multiple generators driving separate antennas for beam forming, electronic mode stirring, phased arrays, or any other phase dependent application. The exciter in one generator can be used as a master phase reference using the external output (112) which is connected to the external inputs (114) of other generators (FIG. 5).

The source switch (118) has two other important functions. First, it is used as a modulator for pulse mode operation. There are many high-power microwave applications where pulsed operation is useful, including microwave induced plasma generators and certain drying systems. This is practically impossible to do with magnetron power generators. If either source switch is on, the signal from that source is fed to the rest of the exciter RF chain. Each switch has an individual enable input. If both switches are off, there is no output. Many embedded microcontrollers have a hardware pulse width modulation (PWM) feature which is often used for motor speed controllers. According to some aspects of the disclosure, the PWM output of the microcontroller is connected through enabling AND gates to the switch enable inputs. Thus, the RF power is switched on and off at the PWM frequency and duty cycle established by the microcontroller software as specified by the user. The RF switch integrated circuit is capable of very high pulse rates with a duty cycle of 1 to 100%. This feature is effective for both the internal synthesizer and external RF sources. Secondly, the microwave generator is equipped with an external on/off connection. This is provided primarily for safety reasons. This input may be connected to external sensors such as microwave leakage detectors, arc detectors, and manual emergency stop buttons. By implementing the on/off function in the RF chain, safety is enhanced because the response time is a few microseconds, which is several orders of magnitude faster than magnetron-based generators. For example, when a 915 MHz magnetron-based microwave generator is turned off due to detection of an arc, it typically takes about 10 seconds for the output power to decrease to zero. In this time, the energy available to the arc is about 250 kilojoules which is more than enough to do serious damage to the waveguide and/or the applicator. According to aspects of the invention, microwave energy can be stopped in 10 microseconds or less. The energy available to the arc is only 0.0025 kilojoules, thereby greatly reducing the potential for damage.

The power output of high-power microwave generators can reach over 20 kilowatts in the 2400-2500 MHz ISM band, and over 100 kilowatts in the 902-928 MHz ISM band. To achieve precise control of the output power needed in certain applications, the exciter output is preferred to have an exceptionally wide dynamic range. For example, to obtain power control for a notional system with a maximum power output of 100 kilowatts with one watt resolution, a dynamic range of 50 dB is required with 0.001% resolution. During band sweeping, the power preset level is preferred to be achieved very quickly, e.g., on the order of a few microseconds at each frequency step. Further complicating matters is the fact that the gain of the transistors in the power amplifier varies with frequency, temperature, and other factors. Consequently, a fixed amplifier drive level would not maintain a constant output power when the generator is frequency sweeping. Therefore, a real time adaptive power control system is provided as part of the present disclosure. This is implemented by a combination of a high-speed, high-resolution RF output power detector, a high-speed wide dynamic range RF attenuator, and novel power control software executed within the microcontroller.

The power control function is implemented by using a digital step attenuator (120) followed by an analog variable gain amplifier (124). The digital step attenuator is a 7-bit device having a 31.75 dB attenuation range with 0.25 db resolution. It receives attenuation level data from the microcontroller via the SPI bus. The data transfer time is less than 2 microseconds. It is followed by a variable gain amplifier (VGA). It has a gain range of +18 to −22 dB which is a 40 dB overall dynamic range. The gain/attenuation of this device is controlled by a voltage input driven by a high-speed 16-bit digital to analog converter. This results in a control resolution of less than 0.001 dB. The DAC receives data from the microcontroller via the SPI bus. The data transfer time is less than 2 microseconds. Together, the digital step attenuator and the VGA provide a 70 dB dynamic control range. Therefore, the attenuator provides the ability to control the output power of a 100 kilowatt microwave generator with less than 1 watt resolution at any power level.

Another preference of the power control function is fast and accurate measurement of the actual power level at the output of the microwave generator. A dual directional coupler (20) is installed on the final RF output of the microwave generator. It provides output taps for forward and reflected power samples typically 50 to 60 dB below the RF output level. The Exciter Unit (10) has two RF power detector devices, one for forward power (150) and the other for reflected power (152). The power detectors produce an output voltage scaled in decibels and proportional to the RF input level. It has a dynamic range of up to 80 dB, so it complements the dynamic range of the attenuator unit. The voltage outputs of the RF detectors are connected to a dual high-speed 16-bit analog to digital converter. This device has two independent A/D converters so both forward and reflected power is sampled at the same instant. The sample rate of this device is one million samples per second; the resolution is less than 0.01%, and the data transfer time to the microcontroller over the SPI bus in less than 4 microseconds.

The absolute accuracy of power measurement is affected by many factors, including variations in construction of the dual directional coupler, connecting coaxial cables, and the associated electronic components. The system software includes a built-in multipoint calibration routine where a laboratory-grade reference power meter is connected to the output of the generator and a series of samples is taken at various power levels and frequencies to determine deviation of measured values from actual. The actual power level of each sample is entered into the system software which then calculates correction coefficients. The correction data is stored in non-volatile memory (148) on the Exciter Unit (10) and is used to adjust subsequent measurements. This calibration is typically done when the system is manufactured and repeated periodically afterwards as required.

A critical part of the Exciter Unit (10) microcontroller software is the Adaptive Power Control (APC) function. It is invoked whenever the user command a new frequency and/or power setting, and during each step during frequency sweep operation. Its main requirements are speed and accuracy. Recall that the actual gain of the power amplifier may vary depending on frequency, temperature, etc. The actual routine is based on a successive approximation method with heuristics for improved performance.

The Band Map (500)

Within the exciter microcontroller's data memory is a data structure, referred to as the "Band Map" (500, FIG. 3) which is a table that contains power presets and measured return loss data. It is organized and indexed by frequency intervals which vary according to the specific ISM band size and the frequency resolution required. It physically resides in the Data Memory (142) of the local microcontroller (140) in the Exciter Unit (10), and there is a copy maintained in the memory of the Host Computer (25). The copies are kept synchronized bidirectionally by the control software. For each frequency step, there are entries for the following data items:

1. Power preset: the nominal desired generator output at that specific frequency. Set by the user or by an automatic scanning function.
2. Return Loss: the most recent measured return loss at that frequency.

The return loss is a logarithmic representation of the ratio of the forward power to the reflected power. It is calculated by:

$$RL(\text{dB}) = 10 \log \frac{Pf}{Pr}$$

Return loss is a useful single figure of merit for indicating the quality of the impedance match of the generator to its load.

The size of the Band Map (500) can vary and depends on the size of the ISM band and the frequency resolution specified by the user. Here are some examples which assume each one table entry per frequency interval and utilize 10 bytes of memory per entry:

2400-2500 MHz band using 1 MHz steps=101 discrete frequencies*10 bytes=1010 bytes 2400-2500 MHz band using 100 KHz MHz steps=1001 discrete frequencies*10 bytes=10010 bytes 902-928 MHz band using 100 KHz steps=261 discrete frequencies*10 bytes=2610 bytes The maximum size is limited only by the amount of available data memory in the microcontroller. An important tradeoff in sizing the Band Map (500) is that the minimum time needed to sweep across the entire band depends on the number of entries in the table. The typical minimum dwell time for each step is 1 millisecond. Therefore, a Band Map (500) with 1001 discrete frequencies will have a maximum speed time of about one second. An example 2400 to 2500 MHz Band Map (500) has 1 MHz intervals and therefore 101 entries. With a 10 millisecond step dwell time, the entire band can be swept in 1.01 second.

The microcontroller has a high speed-data connection to the system's Host Computer (25). The computer runs host software that exchanges data and sends high-level commands to the software running on the microcontroller. Data within the Band Map (500) is continuously transferred up to the Host Computer (25) to update a graphical display of a copy of the Band Map (500). Similarly, the user may modify data entries within the Band Map (500) on the Host Computer (25) individually or using various interactive tools provided in the User Interface program. The modified data is rapidly transferred down to update the Band Map (500) in the microcontroller. The host program on the Host Computer (25) provide functions to load and save Band Map (500) images to mass storage, and to transfer entire pre-defined Band Map (500) to the microcontroller.

As disclosed herein, intrinsic network analysis is a novel and important aspect of the present disclosure. The system provides the functionality of a one port network analyzer. It is capable of accurate real-time measurement of S11 and S21 S-parameters, and of graphically displaying them plotted over frequency. The system includes all the elements necessary to implement a one port network analyzer including: a calibrated and frequency corrected signal source, precision directional couplers (450), calibrated, frequency corrected and high dynamic range logarithmic power detectors to measure incident and reflected power (150 and 152), and software to calculate and display S-parameter plots.

Static and Dynamic network analysis is novel since it allows the user and/or the system itself to measure and adjust the impedance match of the load to the system. It also allows the system to automatically adapt to changes in matching of the generator to its load while running. Often the characteristics of the load, and therefore the applicator impedance, will vary significantly during system operation due to changing properties of the load material. This has been a long-standing source of difficulty for users of microwave heating systems, particularly when using magnetrons.

A static network analysis function is provided in which the Host Computer (25) commands the Exciter Unit (10) to perform a low power frequency sweep across the entire band at each frequency corresponding to each entry in the Band Map (500). The return loss at each frequency is stored in the Band Map (500) table. The return loss data is plotted on the user interface Band Display, which provides the functionality of a one port network analyzer. The system can execute a single or continuous sweeps. The network analysis is of great value to the user: for creation of a Band Map (500), manually or automatically, capable of maximum power delivery to a load with varying load impedance across the band; for testing the transmission lines and applicator; and for manually adjusting the applicator loads or tuning.

The algorithm for the static network analysis load scan is as follows:
1. The output power of the system is set to a low (safe) level, typically 10% or less of the rated output power.
2. The operating frequency is set to the lowest point in the ISM band.
3. The incident and reflected power are read, and the return loss is calculated
4. The return loss is stored at a corresponding entry in the Band Map (500).
5. The operating frequency is increased by the current frequency interval.
6. If the highest point in the band has not been reached, branch to step 3.
7. Load Scan complete.
8. The updated Band Map (500) is transmitted to the Host Computer (25) where it is plotted on the user interface. The Host Computer (25) software has functions that allow rule-based automatic transformation of the return loss data to power presets. There are also functions to allow the user to manually edit the derived Band Map (500).

At the end of the scan, the memory array will contain a map of the return loss across the ISM band. Typically, the return loss Band Map (500) will contain several local maxima and minima which indicate at which frequencies the best and worst matches occur between the generator output and the load. Recall that the frequency scan can be performed very quickly. For example, a full scan of the 902-928 MHz band at 100 KHz intervals requires 260 samples. The entire scan can be performed in about 250 milliseconds. This is sufficiently fast such that for systems that may have dynamic load characteristics, a load scan can be performed at regular intervals to adapt to changing load conditions during regular system operation. Because each transistor is equipped with a conservatively rated circulator and load resistor, the system can easily with stand severely mismatched output impedance, including dead shorts, when performing return loss scans at low power.

Dynamic network analysis is performed while the system is generating RF power in a sweep mode. It will be appreciated that dynamic network analysis with high power microwaves has not been possible previously. This is novel and important since small signal measurements are not necessarily reliable predictors of large signal behavior. As the Exciter Unit control firmware performs each frequency step, the incident and reflected power are read, and the return loss is calculated. The return loss values are stored in a temporary buffer which is read asynchronously by the Host Computer (25) where it is plotted on the user interface Band Display.

The Exciter Unit (10) Automatic Power Control (APC) control function provides dynamic power control and automatic tuning. This function is executed in real time by firmware running on the embedded microcontroller (140) in the Exciter Unit (10). It implements a control loop utilizing: the digital step attenuator (120), the variable gain amplifier (124), feedback from the forward power RF detector (150) and the Band Map (500) table. The digital step attenuator (120) is used for power coarse setting, and the VGA (124) and its D to A Converter (126) is used for fine adjustment giving high speed power control with a dynamic range of over 60 dB. The control algorithm has three operating states. The first APC state is the initial attenuator setting which occurs whenever a new output power setting or a new operating frequency is commanded (i.e., a step while frequency sweeping). An initial value for the digital step attenuator (120) is estimated by calculating a value which provides a power output just below the target power level The VGA is subsequently used for fine power adjustment. The RF power detectors utilize a one mega-sample per second, 16-bit analog-to-digital analog converter (156, 154) to provide a comparable dynamic range. The second APC state is the fine power adjustment. An initial value for the VGA (120) is estimated by calculating a value which slightly less than the difference between the current measured output power and target power level. This is repeated until the target power level is reached, typically with only a few iterations. The target power level can be reached quickly, particular in fast frequency sweep modes. The digital step attenuator (120), the variable gain amplifier (124), and the A/D converter for forward power RF detector (150) all connect to the microcontroller (140) using a SPI serial data bus operating at a minimum transfer speed of 10 MHz. Each data transfer takes place in about 3 microseconds, so the time required for each iteration of the control loop is about 6 microseconds. The overall time required to set a new power level typically takes less than 60 microseconds. This is extremely important when the system is in band sweep mode, as the power may be adjusted every millisecond. The third state is power level maintenance. This is a loop that continuously compares the actual output power to the preset power level, and adjusts the VGA up or down to maintain a constant power level at the set point.

Another important component of the APC function is gain equalization to compensate for characteristics of the power amplifier transistors in the Solid-State Power Amplifier Units (300). The gain of RF power amplifier transistors varies with operating frequency and power output. The change in gain across an ISM band can be significant. As a result, during frequency sweeping operation the system power output will change with a specific setting of the power control attenuators. In the prior art there have been several techniques used in solid state power amplifiers used for gain equalization (see U.S. Pat. No. 7,605,652, which is hereby incorporated by reference in its entirety). Generally, these methods involve sampling the output power level, averaging the result, and applying it to an electrical closed loop to adjust the either input drive to the amplifiers or the transistor gate bias. These techniques were developed for solid state RF amplifiers which carry a modulated carrier. Given that in RF energy applications the amplifier processes an unmodulated CW carrier, there is a simpler and faster means to provide equalization utilizing the embedded microcontroller and the existing APC function. By itself, the APC routine will eventually correct for gain errors, but at the cost of power settling time. To eliminate this delay, the system includes a Gain Equalization Table in EEPROM nonvolatile memory (148) on the Exciter Unit (10). When a change in frequency or power setting occurs, an adjustment value (positive or negative) is obtained from the table and added to the power control attenuator setting. Transistors of a specific type tend to have very similar frequency/power/gain characteristics; so typically, table needs only to be initialized once at the time of manufacture. However, a self-calibration can be performed more often if required.

As disclosed herein, dynamic frequency sweeping is a novel and important aspect of the present disclosure. The basic operation of a frequency sweep is stepping across the ISM band at discrete frequency increments. The step rate is variable and can be set by the user from a minimum of 1 millisecond per step, with no defined maximum. Starting at the beginning frequency at the band, the microcontroller first sets an interval timer to the specified step interval. Then it sets the frequency synthesizer to the current frequency. Next, it sets the phase shifter to the corresponding value from the Band Map (500). Next, it obtains a power set value from the corresponding Band Map (500) table entry and calls the Adaptive Power Control Routine to establish that power (subject to return loss adjustments). Finally, it sends data including current power output and return loss to the Master System Control Computer which updates its copy of the Band Map (500) and graphical user interface as appropriate. The software then waits for the interval timer to expire. The frequency is incremented to the next value, and this entire process is repeated until the end of the band is reached. The current working frequency is then reset to the beginning frequency of the band and the round-robin continues indefinitely.

There is a special case in the frequency sweep routine to facilitate a frequency hopping function. If the current power preset value in the Band Map (500) is zero, the RF output is turned off and sweep routine will immediately skip to the next entry with a non-zero value. If a Band Map (500) is built with adjacent groups of zero and other groups on non-zero power presets, the system will output power continuously only in the selected frequencies or bands. This is particularly useful when the load (application) has favorable impedance matches or energy distributions only at certain frequencies or frequency ranges.

An Adaptive Power mode of operation is provided where dynamic adjustment of power relative to a preset power level occurs while the system is generating RF power. The system therefore is able to safely deliver the maximum possible average power to the load over a range of frequencies over time even as the impedance of the load changes significantly. This function is executed in real time by firmware running on the embedded microcontroller in the Exciter Unit (10). At the beginning of each frequency step during a sweeping operation, the Exciter Unit (10) changes the frequency of the digital frequency synthesizer to the new frequency. Next, the microcontroller reads the system's forward and reflected output power and calculates the instantaneous return loss value, which is compared to the Adaptive Return Loss and the Absolute Return Loss limit settings. It then invokes the APC function using the power preset value obtained from the Band Map (500) table as follows: a) the full preset power is set if the measured return loss is greater or equal to the Adaptive Return Loss Limit; b) zero power is set and the current frequency step is terminated if the measured return loss is less than or equal to the Absolute Return Loss Limit; or c) If the measured return loss is less than the Adaptive Return Loss Limit and above the Absolute Return Loss Limit, the power preset at that frequency will reduced by a user defined dB power amount per dB of measured power below the Adaptive Return Loss Limit. As a result, full power to be generated at all frequencies above the Adaptive Return Loss Limit, at proportionally reduced power at frequencies below the Adaptive Return Loss Limit and no power will be generated at frequencies below the Absolute Return Loss Limit. This feature can also be used in single frequency operation.

For applications where the generator is used in a single frequency mode (not frequency sweeping), a one-button auto-tune function is provided. When the user clicks on the Best Frequency button on the user interface display, the system performs a static network analysis return loss scan across the band. The result is plotted on the Band Display. The Host Computer (25) then searches for the frequency where the maximum return loss occurs, and sets the generator's operating frequency to that frequency.

Solid-State Power Amplifier Units

Microwave power transistors providing about 300 watts in the S band and 750 watts in the L band are commercially available at this time. It is probable that over time the power handling capabilities of the RF power transistors will increase as semiconductor processes continue to evolve. The technique of paralleling power transistors in phase or in quadrature phase by splitting and input and combining output has been well established in the prior art and has been used for many years in radar, electronic warfare, solid state radio and television broadcast transmitters (see Contantonio, et. al. pp. 370-375; Walker p. 242; and U.S. Pat. No. 9,595,930, all of which are hereby incorporated by reference in their entirety). A variety of methods of implementing parallel amplifiers have been implemented in the past. Aspects of the invention significantly improves this technique by adding automatic phase and amplitude alignment in a frequency-agile system which is important at microwave operating frequencies. This reduce losses and heating in the output combiners and increases the amplifier efficiency.

The Solid-State Power Amplifier (SSPA) units (300 and FIG. 5) are built around a plurality of RF power amplifier transistor pallets (400). A pallet comprises a single power transistor and associated components mounted on a circuit board which is attached to copper heat spreader and is in turn mounted to a heat sink. The pallet may optionally contain a driver transistor and possibly a circulator with a load resistor. Like the combiner used to combiner the SSPAs, the PA pallets (400) should be phase matched and amplitude balanced to drive their combiner (440) with maximum efficiency (see below). The pallets are installed in the SSPA (300) as shown in FIG. 5. Currently, a configuration of four pallets is optimal with respect to power combining, thermal management, and connector cost. Alternative configurations of fewer or more pallets are possible. A Power Amplifier Control Unit (480) interfaces to the pallets and provides RF drive and control functions for the pallets. A dedicated microcontroller (460) provides local management of all elements of the Power Amplifier control circuits including: DC power monitors (470) which monitor the drain voltage and current of each PA transistor; and the PA Bias Controller (480) which provides active temperature compensated biasing for each PA transistor. The RF section receives input from the Exciter Unit (10) via the input power divider (310). The RF signal first passes through a phase shifter (410) and a variable attenuator (415), respectively, and both are controlled by the local microcontroller (460). The devices are used to phase and amplitude match the output of the SSPAs (300) to the other SSPAs (300) in the overall system. As is the case with almost all RF combiners, it is important that the power at each input port be matched in phase, and to a somewhat lesser degree, matched in amplitude. This is explained by Melton, et. al, in U.S. Pat. No. 5,561,395, herein incorporated by reference in its entirety, which describes a static method of phase and amplitude matching. Phase variation of less than 5-degrees or amplitude variation of less than 5% will not significantly reduce overall combiner efficiency.

A novel capability of the present disclosure is gain and matching of the RF power transistors. It is a characteristic of both LDMOS and GaN transistor that the gain of each device varies primarily with temperature and frequency, and additionally due to differences in characteristics of associated components (especially capacitors), printed circuit boards, and the exact mechanical assembly of the RF pallets (400). The gain can be adjusted by changing the gate bias voltage which is established by digital-to-analog converters (480) which are controlled by the microcontroller (460). The drain current of each PA transistor is measured by the DC Monitor circuit (470), comprising a current sense resistor in the drain power supply line and a current monitor integrated circuit device which provides an accurate digital value of the PA drain current to the microcontroller (460). The drain current is directly proportional to the RF output of the device. During system calibration, the microcontroller can measure the drain current at various power levels and frequencies across the ISM bands. This data is stored and used to set the baseline DC bias level. During operation, the baseline bias value is changed dynamically based on the measured temperature of each PA pallet.

Next in the RF chain is an amplifier to compensate for losses in the various devices, followed by an n-way zero-degree power divider that distributes the drive signal to the individual PA Pallets (400) via a Monolithic Phase and Amplitude Controller (MPAC) (404). An example device is the PE46136 manufactured by Peregrine Semiconductor, Inc. Although MPACs were developed for a completely different application (Doherty cellular amplifiers) they are an excellent fit for this application. The MPAC (404) used contains a 4-bit digital step attenuator with a 7.5 dB range and a 5-bit digital phase shifter with an 87.2 degree range, both being more than adequate for phase and amplitude matching of the PA pallets. The MPAC (404) device has one high speed connection the local SPI data bus, permitting the microcontroller to rapidly phase match and amplitude balance the pallets. Another method of matching and balancing used in prior art involves a quadrature modulator. The RF input is fed to the local oscillator input and a pair of digital to analog converters is used to drive the in-phase (I) and quadrature (Q) inputs. Depending on the values of the I and Q inputs, the output of the modular can be varied in phase and amplitude. This requires more devices, is more expensive, takes more PCB space, and adds computational overhead to the system's software.

The outputs of the pallets are equipped with circulators and associated load resistors to provide a good impedance match for the transistors and to protect them from excessive reflected power. They also provide a good input impedance match to the output power combiner. The individual outputs are combined to a single master output using an n-way zero-degree combiner (440). This is preferably a Wilkinson or rat-race type. Finally, a dual directional coupler is provided to sample the forward and reflected power. These are connected to two RF detector devices which are part of the SSPA. These are connected to the microcontroller (460) and the return loss is constantly monitored to protect the transistors from excessive reflected power.

Mechanically, the SSPA is built within a metal enclosure to provide basic RF shielding. The base of the unit is a heat sink, either an air-cooled finned type, or water-cooled cold plate. All external connections including the RF input, RF output, and control system data bus are some type of a plug or jack, so the module can be conveniently replaced as a unit.

The firmware in the microcontroller (460) normally executes in a non-ending loop, continuously repeating defined control and monitoring functions. These steps are:
1. Responding to messages from the Host Computer (25) received over the Control System Data Bus. These messages contain commands for the SSPA to execute or requests for data. Commands include: return status (including forward and reverse power, drain current, temperatures, faults, etc.); performing calibration routines; set phase and amplitude; read flash memory data, etc.
2. Active temperature compensated management of the PA and driver transistors.
3. Monitoring PA transistor heat sink temperature and checking for over limit conditions.
4. Monitoring and adjusting PA transistor drain current to ensure it is within limits and all transistors are operating optimally and correctly.

Single High Power Output Configuration

Figure 6:
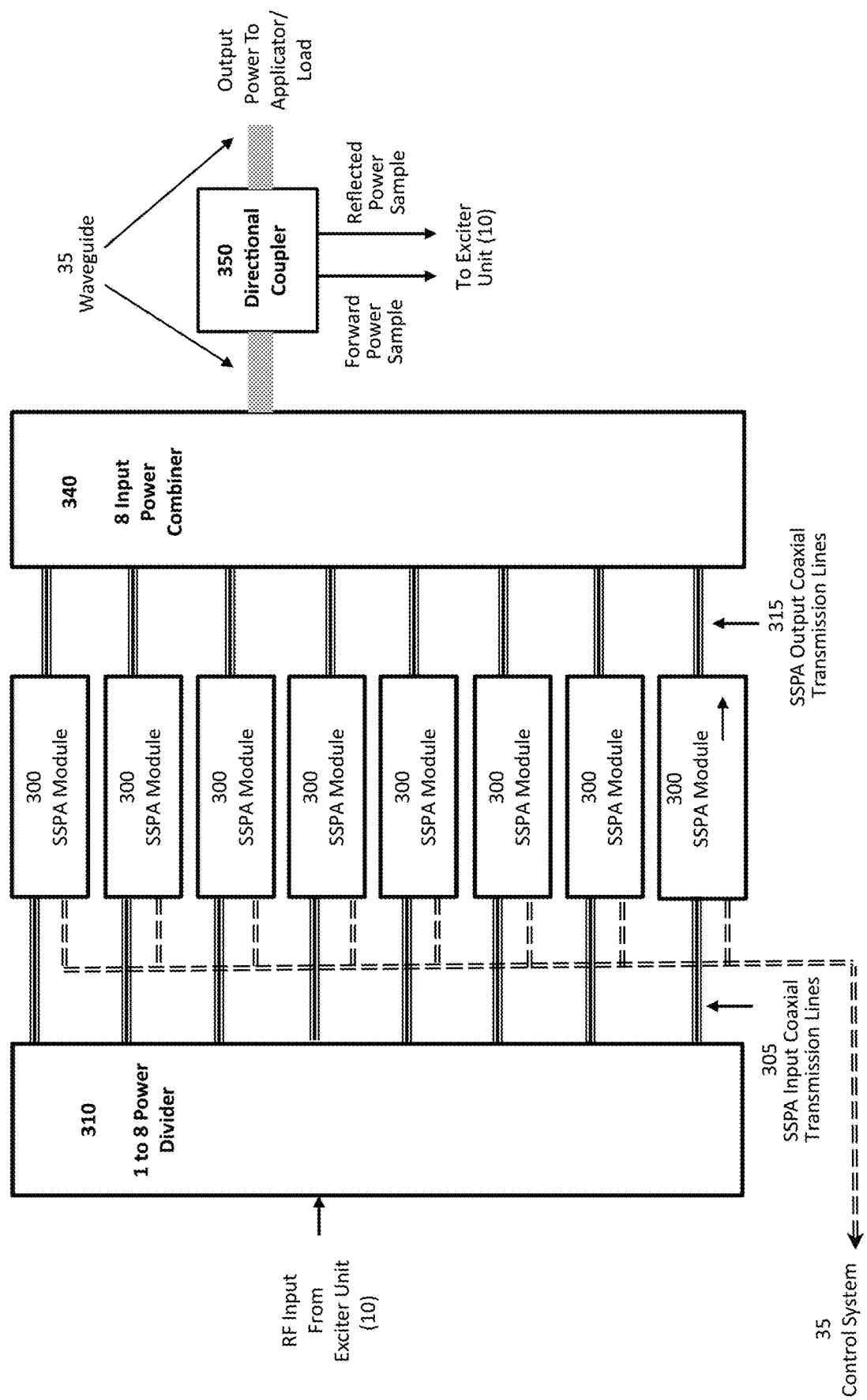
FIG. 6 is a schematic representation of independent output configurations for a plurality of SSPA modules.

The Microwave Power Amplifier Assembly (15) is the overall power amplifier subsystem. It is comprised of many SSPAs (300) operated in parallel. The modular architecture allows construction of systems having a wide range of total power outputs. The example in FIG. 6 illustrates a system having eight SSPAs. If the modules used are of the 3-kilowatt L band type, the maximum system power output will be 24 kilowatts (less combiner loss). Likewise, increasing to a total of 32 power amplifiers will produce a maximum of 96 kilowatts. The practical limit depends, at least in part, of the output combiner power handling capability. The input drive from the Exciter Unit (10) is divided by an n-way zero-degree power divider (310). Its individual outputs feed each SSPA (300). As a result, the frequency, phase, and power output of the SSPAs will track the exciter output closely, but not perfectly due to phase changes and attenuation in interconnecting cables, connectors, and other component tolerances.

The outputs of the SSPAs (300) are combined to produce a single output by an n-way radial or other suitable combiner (340) (see U.S. Pat. No. 4,933,651). It is possible to utilize different kinds of output combiners depending on the application and cost considerations. For all but the lowest power systems, the radial combiner is preferred due to its very low-loss, potentially large number of input ports, and overall cost effectiveness. Radial combiners have been used with solid-state power amplifiers, particularly in radar systems and broadcast transmitters. As is the case with most RF combiners, it is important that the power at each input port be matched in phase, and to a somewhat lesser degree, matched in amplitude.

As mentioned above, Melton, et. al, in U.S. Pat. No. 5,561,395 describes a static method of phase and amplitude matching. While a simple static phase and amplitude adjustment method is adequate for systems with relatively constant impedance loads such as a broadcast transmitting antenna, it is not effective for system with changing load impedances such as is the case in RF energy systems. Phase mismatches of about 10 degrees or less will not significantly reduce output power. Many factors can cause differential and common mode phase shifts in the parallel RF paths through the system. First, there are the mechanical and electrical lengths of transmission lines including coaxial cables, connectors, and printed circuit board traces. These are to be manufactured so that all are closely matched in electrical length. For example, at a frequency of 2450 MHz a transmission line using coaxial cable with a typical velocity of propagation of 0.8 has a wavelength of 9.76 cm. Dividing this by 360 gives the electrical length per degree, which is 0.027 cm/degree. Assuming a maximum desired phase imbalance of 5-degrees, the corresponding maximum electrical length difference is 1.35 mm. In the current art, connections from SSPAs to splitters and combiners typically utilize costly precision cut and terminated coaxial cable sets, or expensive and complex air dielectric rigid coaxial plumbing. Even so, there is another significant problem due to thermal effects. The interconnecting cable increase in temperature due to: a) increase in the ambient temperature of the high power electronic components that comprise the generator; and b) heating of the dielectric and conductors within the cables which is considerable due to the high-power at high frequency transmitted through them. This increase in temperature causes a physical expansion of the length and diameter of the cables resulting in phase imbalances. Other causes of phase imbalance in the parallel RF patch include the input divider (310), and variations in manufacturing tolerances and thermal behavior of components within the SSPAs (300).

As disclosed herein, the invention provides a novel method of automatically and dynamic matching of phase and amplitude of multiple SSPAs using a combined hardware and software technique. The phase matching cycle is performed as follows.

1. The Host Computer (25) commands the SSPA local microcontrollers (460) to set the phase shifters (410) on every SSPA to mid-range (approximately 180°).
2. The Host Computer (25) commands the SSPA local microcontrollers (460) to adjust the variable attenuators (415) so the power output of all SSPA modules are equal as measured by the calibrated SSPA local directional couplers (450) and the forward power RF detectors (432). The SSPAs will then be amplitude balanced within acceptable limits.
3. In a system having n SSPA modules, The Host Computer (25) commands the SSPA local microcontrollers (460), one at a time starting with SSPA module number n+1, to adjust the SSPA's phase shifter a stepwise increase or decrease phase shift, using a successive approximation method. As each SSPA's output approaches the same phase with respect to previously adjusted SSPAs, the power output of the output combiner (340) will increase. At the power maxima, the SSPA will be phase matched. After each adjustment, the Host Computer (25) measures the system total output power at the output directional coupler (450) by means of the forward power RF detector (150) which is a part of the exciter unit (10). The successive approximation software routine operates to maximize total power output as the phase of each SSPA is adjusted. After all adjustments have been made, all the SSPAs will be phase matched.

As the number of SSPAs installed in a system increases, the effect of any one SSPA's phase adjustment on total system power output diminishes proportionally. For this reason, the RF detector (150) which is part of the Exciter Unit (10) has exceptional dynamic range, preferably 60 dB or more. This permits measurement of changes in power output of one part per million at the generator power output.

This phase and amplitude alignment process can be performed at the time of manufacture, and periodically thereafter. The calibration settings can be saved in non-volatile memory and recalled at system startup. Depending on specific details of how the microwave generator is constructed and cooled, phase alignment may change during operation, primarily because of thermal effects on cables and components, as discussed previously. Since the RF energy is not modulated in this application, it is possible to execute the phase alignment process periodically while the system is running, thus ensuring maximum performance at all times and under all operating conditions. The software provides an interlock so the power control routine does not attempt to change output power during the calibration process, which typically takes a few seconds. This is a unique and significant benefit.

Combining Output from Multiple Generators

To achieve high-power output of 20 kilowatts or more in the S band and 100 kilowatts or more in the L Band, many power amplifier transistors are operated in parallel, and their outputs are combined in a hierarchy of two levels. This architecture also facilitates a three level corporate configuration where the outputs of multiple generators can be combined in waveguide (see FIG. 4) to achieve very high overall power output levels.

Figure 4:
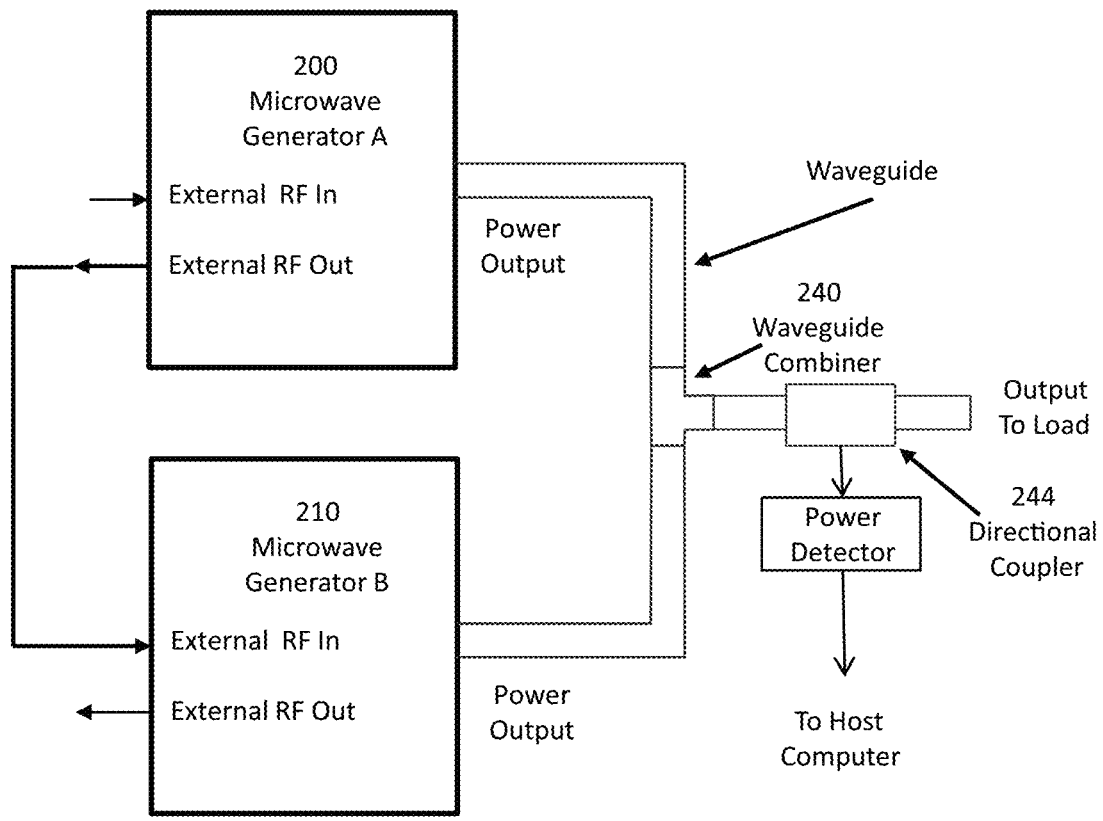
FIG. 4 is a schematic illustration of phase matching of two generators, as disclosed herein.
Figure 5:
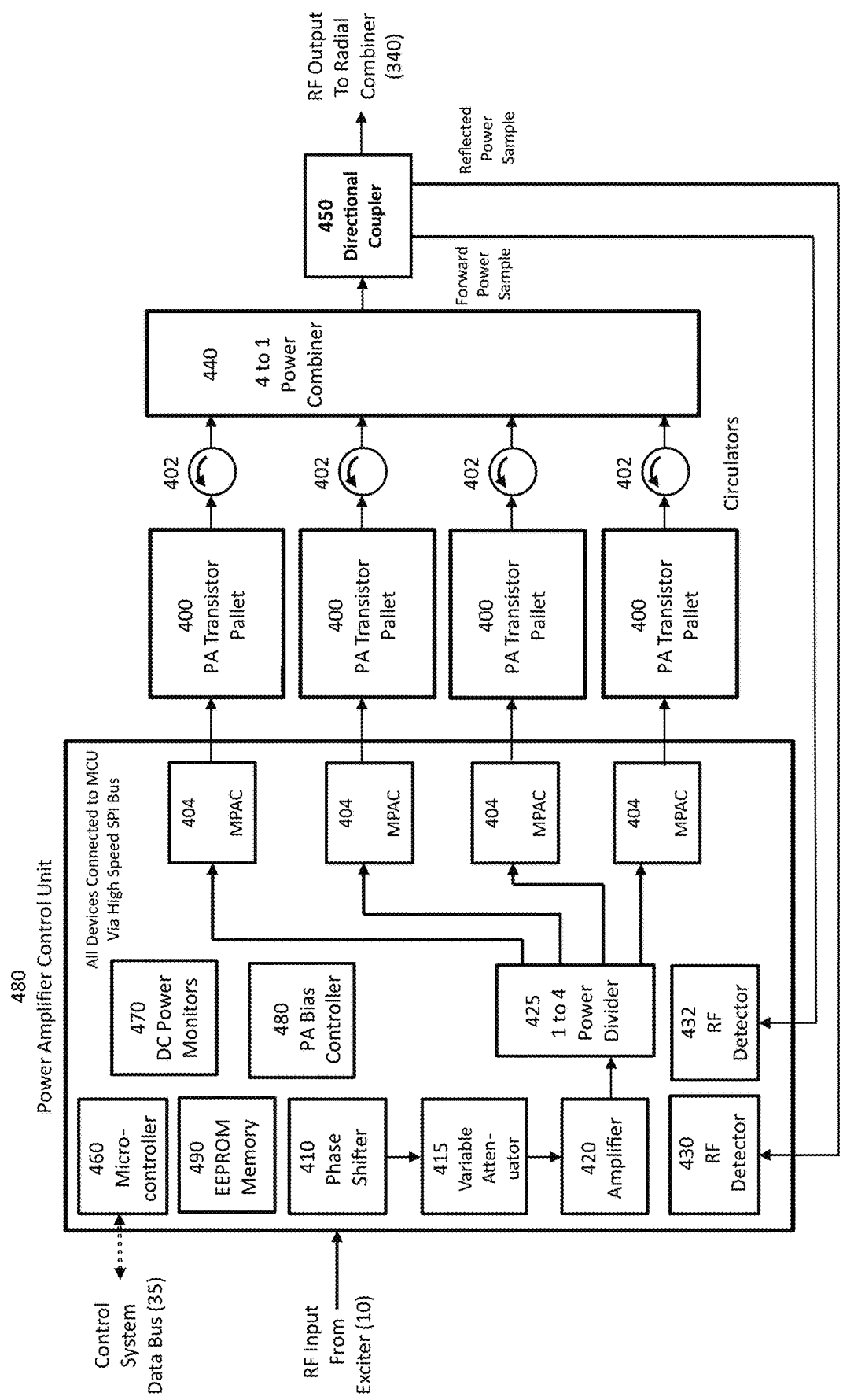
FIG. 5 is a schematic representation of a solid state power amplifier (SSPA) module according to aspects of the invention.

As shown in FIG. 4, this configuration utilizes the provided Exciter Output and RF Input external connections, which are internally router to the Exciter Unit (10). The same Host Computer (25) controls both generators. In a basic example, the Exciter Output of microwave generator System A (200) is connected to the RF Input connector of System B (210). The waveguide RF outputs of both systems are connected to a waveguide two-way power combiner (240), which may be a Tuned-T, Magic-T, or some other suitable type. The output of the waveguide power combiner is connected to the load through a directional coupler (244). Power detectors on the directional coupler are connected to the Host Computer (25). The software configures System B (210) to receive its low level RF drive from its external RF Input. In this configuration, the Exciter Unit (10) of System A (200) provides frequency, power, and modulation control for both systems. In order to phase match the systems, both generators are turned on and set to a low output power level. Using the phase shifter and attenuator provided on Power Amplifier Control Unit (480), the software executes a successive approximation tuning algorithm while monitoring the power measured from the output directional coupler. When the both systems are in phase, the power output will be at maximum.

Multiple Independent Output Configurations

Figure 7:
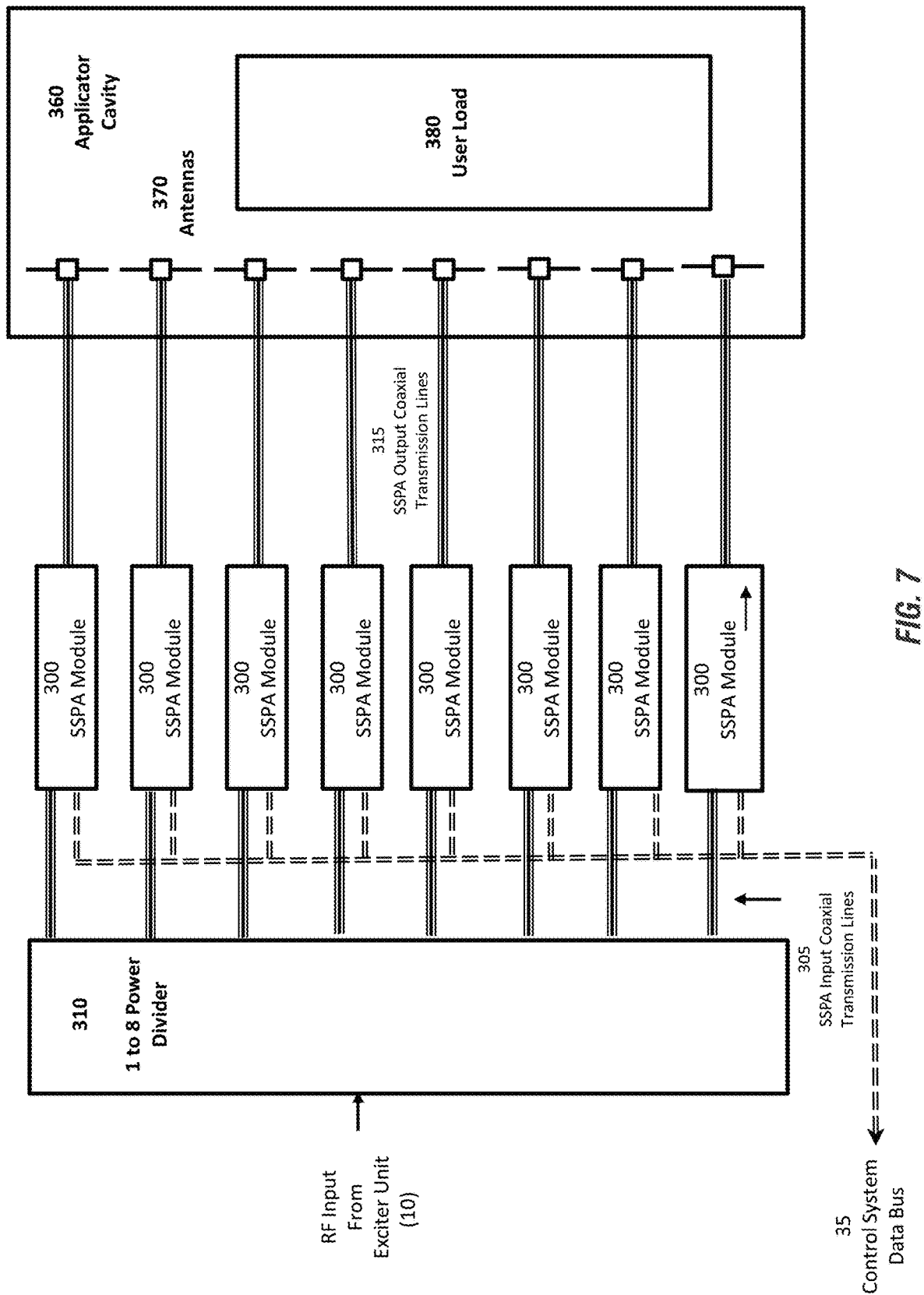
FIG. 7 is a schematic representation of combining the outputs of a plurality of SSPA modules.

The system architecture described herein allows an alternative system configuration where the output of each SSPA may be connected individually to antennas in the applicator rather than being combined to into a single RF output (see FIG. 7). This configuration permits many useful and novel capabilities that take advantage of the abilities of solid state generators to provide precise phase, power, and frequency control. Despite previous attempts (see, e.g., U.S. Pat. No. 6,680,467), this has not been possible previously using magnetrons, which are too unstable to be phase controlled. When multiple antennas are installed in a cavity, it is possible to control the three dimensional distribution of energy/heating by varying the relative phase and amplitude of the exciting microwave power feeds. Depending on the number of antennas and their configuration, beamforming is possible to allow selective area heating within the cavity. There are many useful types of antennas including monopoles, dipoles, patches, etc. which can be configured in a virtually infinite number of ways. Aspects of the invention will provide a powerful platform for future developers of a myriad of microwave energy applications utilizing three dimensional RF field control.

Figure 2:
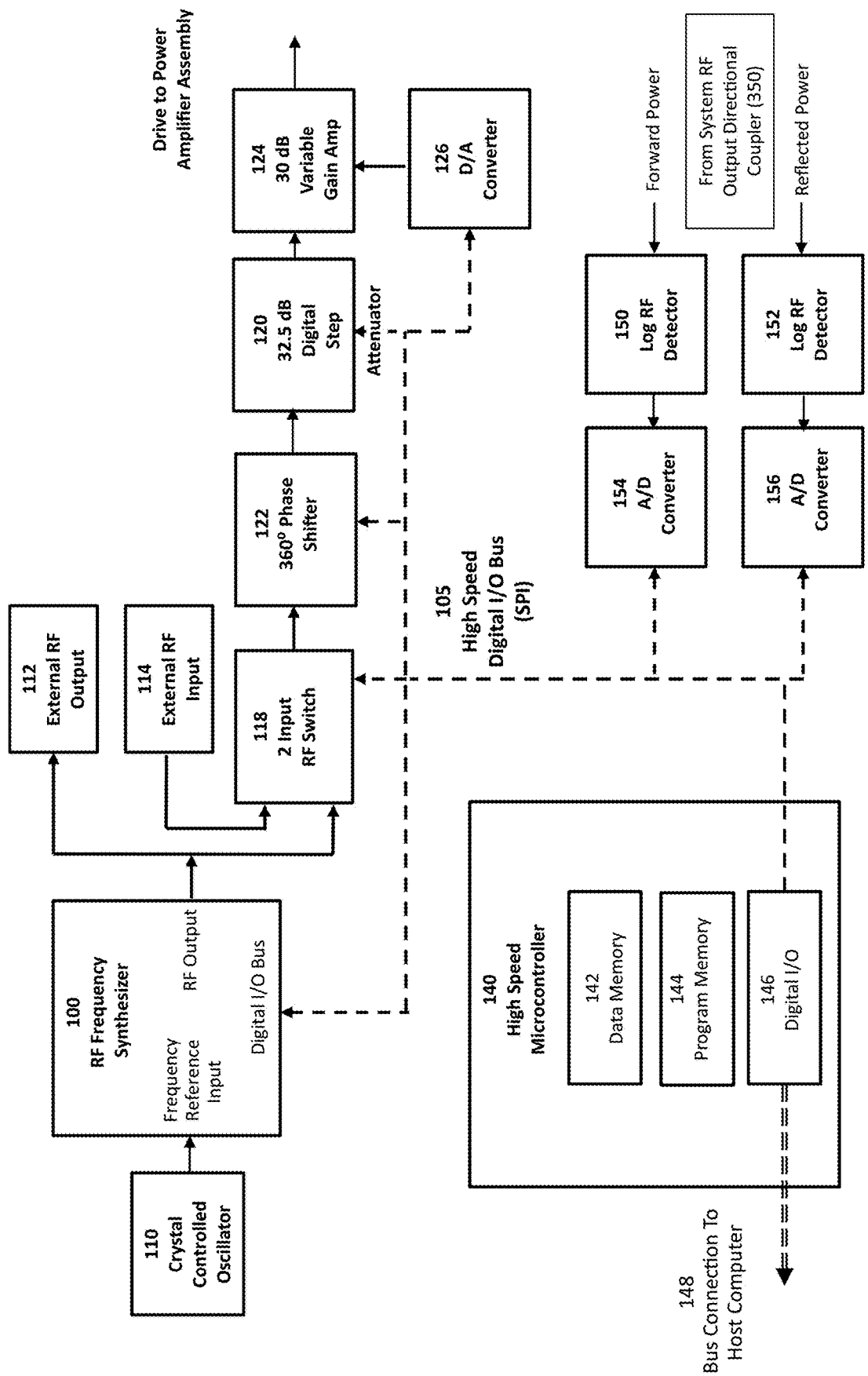
FIG. 2 is a schematic depiction of an exciter module according to aspects of the invention.

In this configuration, the individual output of each SSPA is made available via RF connectors on the back panel of the system. A length of coaxial cable interconnects the RF outputs to antennas on the applicator. It will be appreciated that coaxial cable is less costly and easier to work with than waveguide. As the Power Amplifier Control Unit (480) incorporated into each SSPA includes a phase shifter (410) and variable attenuator (415), the amplitude and phase of the feed to each antenna can be independent controlled by the user. This is further facilitated by using a single RF Frequency Synthesizer (100) to provide a common phase drive signal utilizing the external RF output (112) of a master Exciter Module (FIG. 2) to drive the external inputs (114) of all other SSPA exciter modules, which provides a common phase baseline.

The system's Host Software provides software interfaces for user-developed algorithms that can manage the electromagnetic field generation using dynamic control of phase and frequency of each RF output. The user software can also access to the systems real-time measurement of forward and reflected power at each RF output.

Host Computer and User Interface

The Host Computer (25) is a standard personal computer, either desktop or laptop, running Microsoft Windows® or Linux operating systems. However, as mentioned herein, it can be generally any device having a processing unit and capable of operating software associated with the components disclosed herein. It is connected via a USB or Ethernet (45) to the General I/O Unit (40) within the microwave generator. The General I/O unit has a Network Bridge (42) device which translates bus communications from the USB/Ethernet connection (45) to the generators internal Control System Data Bus (35). This permits high-speed communications between the Host Computer (25), the Exciter Unit (10) and each of the SSPA modules (300). The Control System Data Bus (35) is preferably an RF-resistant high-speed differential serial bus. The invention includes a message-based protocol with error detection and retransmission. All communications are initiated by the Host Computer (25), which sends command messages to the local microcontrollers embedded in the generator's various functional units. The messages command the microcontroller to execute a desired function or return data to the Host Computer (25).

The architecture, according to aspects of the invention, pushes all real-time functions down to the embedded microcontrollers, which results in very fast response times required by the band sweep operations. It also facilitates the use of a general PC to run the supervisory program and user interface. The benefit of using a PC is that it provides many network connectivity possibilities, and facilitates the use of third party application software. Typical PC operating systems are not capable of running high-speed real-time control applications. In the current art, commercial low power microwave generators utilize a single embedded microcontroller to perform all control functions, typically using small an LCD display and push buttons on the front panel to provide a primitive user interface, and at best a simple serial data connection with basic functionality for external control.

Figure 8:
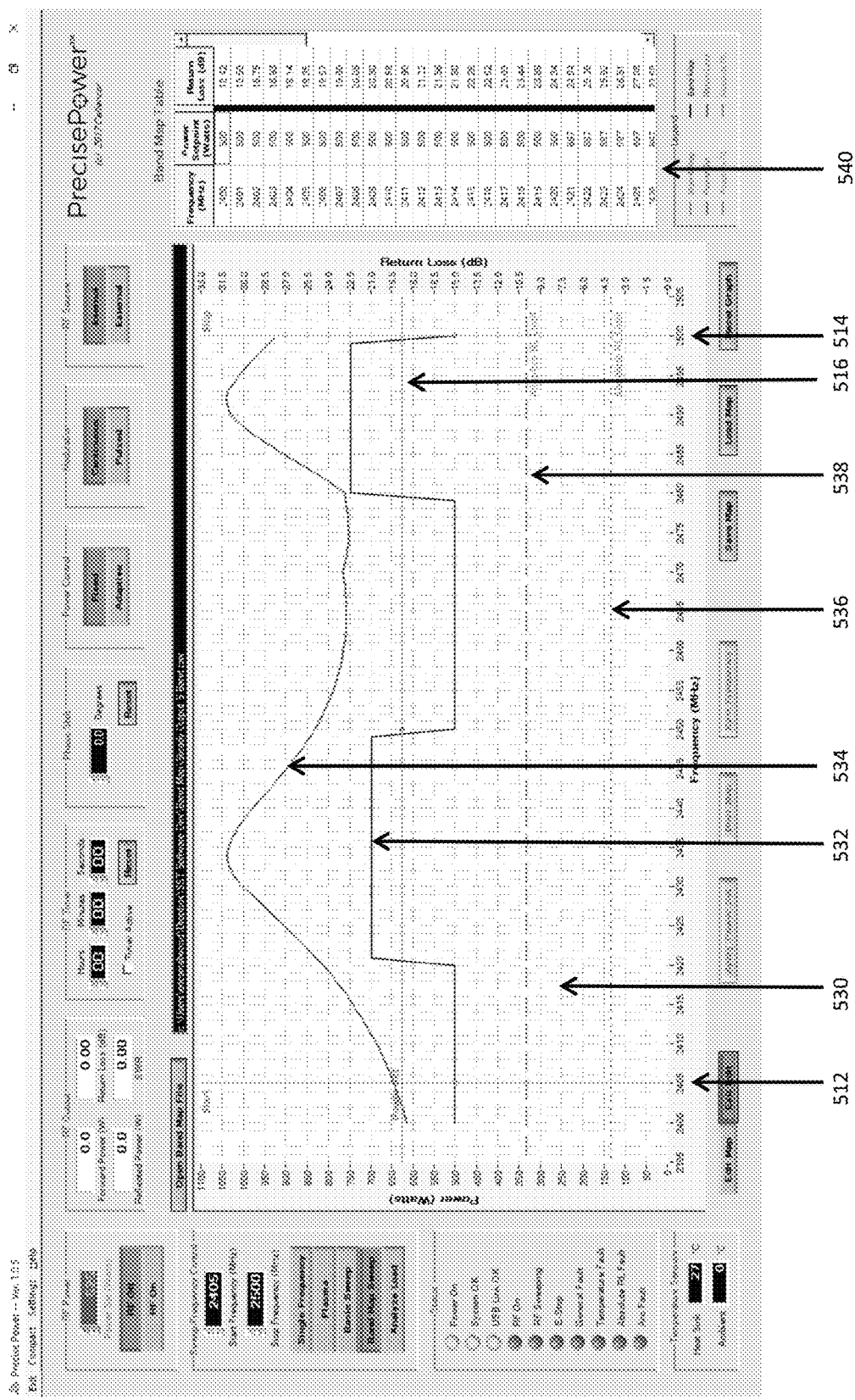
FIG. 8 is an exemplary user interface screen for use with the systems of the present disclosure.

The Host Computer (25) runs a host application program (FIG. 7) used to operate the microwave generator system. This program provides the following main functions:
1. The main high-level supervisory, control, and monitoring functions of the microwave generator.
2. System set up, calibration, user option selection (See FIG. 8), and firmware updating.
3. User controls for: operating modes, RF Power on/off, CW/pulse mode selection, internal or external RF sourcing, and other miscellaneous functions
4. User control of power output, frequency sweeping modes, and system phase adjustment.
5. Real-time display of system data using a graphical display of the Band Map (500) table and return loss plots.
6. Interactive editing of the Band Map (500), and the ability to load and save Band Maps (500) to mass storage devices.
7. Display and management of system fault conditions.
8. Provides software interfaces to user-supplied control programs such as Windows programs, LabView programs, etc.

The primary user interface screen (FIG. 8) provides a graphical representation of the Band Display (530), the Band Map Table (540) and other related user controls. The large graph in the center of the screen is the Band Display graph which displays the Band Map (500) (the current power presets versus operating frequencies across the band). It can also display return loss measurements and return loss limits. The items displayed on the Band Display will change depending on the current operating mode. When the system is generating RF power, the Exciter Unit (10) sends real time power output and return loss data to the Host Computer (25) (2) over the Control System Data Bus (35). This allows the Band Map (500) data to be updated in real-time to show animated operating graphs and numeric readouts on the Band Map (540) display. This is of great value to the user since actual operating conditions can be observed by the user in real time.

Along the right side is the Band Map Table (540), which is a table showing the editable power preset and measured return loss plotted on the Band Display. Along the top of the screen are pull-downs for various option panels. User controls and data displays are grouped around the Band Display.

The Band Map (500) power presets (532) plotted on the Band Display (see FIG. 8) are synchronized in with the copy of the Band Map (500) contained in the Exciter Unit (10) microcontroller's (140) data memory (142). The Host Computer (25) and Exciter Unit (10) are synchronized in near real-time while the system is running via messages sent over the Control System Data Bus (35). Therefore, changes made to either copy will be quickly reflected in the other copy. Control buttons permit the Band Map (500) to be saved to or loaded from mass storage, and to be downloaded to the Exciter Unit (10).

If Single Frequency Mode is selected, he Band Display shows a single vertical cursor at the currently selected frequency. The frequency can be changed by dragging the frequency cursor or by manually entering a value in the Start Frequency Box. Generally, the frequency selected is where the applicator/load offers the highest return loss. The Best Map button will automatically find and set the optimum frequency by performing a load analysis (auto-tuning). The Absolute RL Limit setting (dotted orange line) applies in this mode. Adaptive Power Control can be enabled in this mode.

The Analyze Load button initiates a static network analysis across the band as previously described. The results are plotted (543) on the Band Display.

The Basic Sweep mode can be used to sweep across the whole band or within a single range of frequencies at a fixed power level. To operate in Basic Sweep Mode, the following steps are performed:

1. Optionally, an Analyze Load scan is run to provide a picture of the return loss across the band.
2. Clicking on Basic Sweep.
3. Dragging the left Start cursor (512) to the desired start frequency.
4. Dragging the right Stop cursor (514) to the desired end frequency.
5. Dragging the Power Set cursor (516) to the desired power level.
6. Clicking on the RF ON button to start sweeping.

In some instances, the whole sweep is performed at the specified single power level. If the return loss is poor at some frequencies or is expected to change significantly while running, the Adaptive mode can be enabled to allow dynamic power adjustment based on measured return loss.

The user interface includes a set of interactive functions for creating and editing the Band Map (500) shown on the Band Display. The methods available include: using the automatic Best Map function; manually using the editing cursors on the Band Display grid; and manually by entering numeric data into the Band Map (500) Table. Using any combination of the above actions is also possible. A Band Map (500) editor function allows the user to interactively define discrete frequency blocks and their associated power preset values by dragging editing cursors on the Band Display. As the editing occurs, all changes to the Band Map (500) are transmitted from the Host Computer (25) to the Exciter Unit (10) via the system bus to maintain synchronization.

The Best Map feature provides for automatic creation of a Band Map (500) that delivers maximum possible power across the entire band when the return loss may be poor in some frequency ranges. This provides a fast, convenient, and accurate method to automatically build a Band Map (500) that is representative of actual load conditions in the frequency domain, and allows the microwave generator system to simultaneously provide maximum power delivery and frequency diversity in cases where loads vary considerable over time.

This is accomplished by the Host Computer (25) commanding the Exciter Unit to perform a return loss scan. It then sets the Band Map (500) and power preset values in the Band Map (500) table according to user-defined rules to obtain an optimal operating frequency/power profile.

Figure 9:
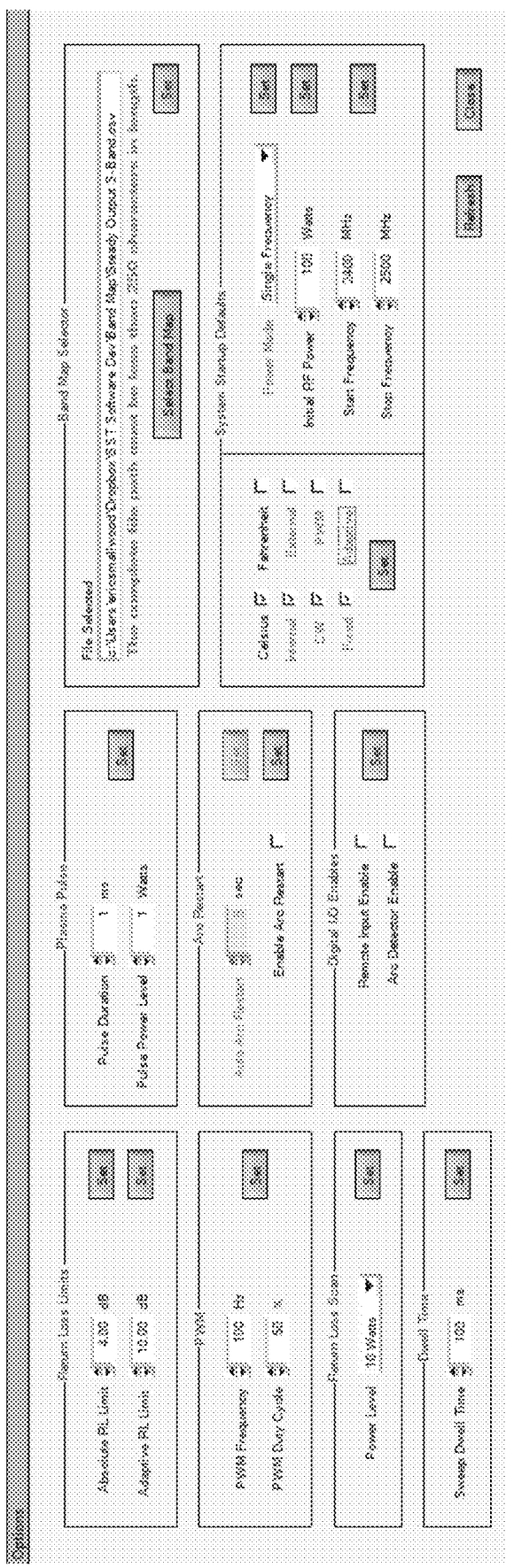
FIG. 9 is an exemplary user options screen as part of the user interface according to aspects of the invention.

Accordingly, a Band Map (500) may be built in the following manner:

1. The user sets an "Adaptive RL Limit" value in the Options panel (FIG. 9) to the level where power reduction should begin.
2. The user set an "Absolute RL Limit" value in the Options panel (FIG. 9). Any frequency that has a return loss lower or equal to this limit will have its power preset set to zero watts and will be skipped during the sweep.
3. The user drags the Power Preset Cursor (516) to the nominal desired RF power level.
4. The user enters edit mode, then clicks on the Best Map button. A return loss scan is performed by the Exciter Unit (10) and transferred to the Host Computer (25), and is then plotted on the display.
5. At each frequency, the power preset will be set automatically according to these rules:
   a. Full preset power if the measured return loss is greater or equal to the Adaptive RL Limit.
   b. Zero power if the measured return loss is less than or equal to the Absolute RL Limit.
   c. If the measured return loss is less than the Adaptive RL Limit and above the Absolute RL Limit, the power preset at that frequency will reduced by user specified dB power reduction per 1 dB of measured power below the Adaptive RL Limit.
6. Clicking the RF ON button will initiate the Band Map sweep operation.

Plasma Excitation

Microwave power sources are commonly used to energize gas plasma generators. These generate plasma in a process gas forming highly reactive radicals within the gas stream. These devices are extensively used in the semiconductor manufacturing industry for oxidation cleaning, etching, stripping, coating, and surface modification of semiconductor wafer. There are similar applications in other industries.

There are many types and variations of gas plasma applicators. A typical apparatus comprises a cavity, which may be cylindrical or rectangular, or a section of waveguide. It may be resonant or non-resonant. A quartz or sapphire tube passes through the cavity or waveguide and is positioned so its center is in the region where the strongest electrical field will occur. The plasma gas flows through the tube, and further to the process. Microwave energy from a generator is applied to the cavity, typically using waveguide. Excitation of the gas creates the plasma. The gas flow rate, pressure, and microwave power are to be properly adjusted to produce a stable and controllable plasma.

Magnetron power sources used in the past have been less than ideal due to frequency instability and difficulties with fast and accurate power control. These systems can be equipped with a waveguide tuner, which is costly, difficult to adjust and keep adjusted, and slow. A solid state microwave generator provides a better solution to these problems.

In gas plasma systems, a short burst of high power energy is required to initiate the plasma. Often, a special high voltage igniter system is used for this purpose. However, it also possible to use a short high power microwave pulse to ignite the plasma, thus reducing the cost and complexity of the apparatus. This is referred to as an "ignition pulse". After the plasma has been struck, the microwave energy is reduced to a "maintain level". Aspects of the invention provides a novel and important function for exciting plasma generators. In the system's Plasma Mode, the user may specify options to characterize: a) the preset power level and duration of an ignition pulse; and b) the preset power level and optional pulse modulation for the maintain state (See FIG. 9). When the system in Plasma Mode and it receives an RF Power On command, the Exciter Unit (25) sets the power level to the ignition pulse preset level. During the ignition pulse time, the system's automatic minimum return loss checking is disabled. The system can easily determine whether or not the plasma was actually struck by monitoring and looking for a significant increase in the measured return loss. If the plasma was not initiated the system will increase power and repeat the ignition pulse.

In some applications, pulsing of the microwave energy can result in more precise control of the plasma. If pulse modulation is selected, the hardware PWM unit in the microcontroller (140) is initialized and enabled, which is turn modulates the RF drive signal by means of the RF switch (118). After the ignition pulse period expires, the Exciter Unit (10) reduces power to the preset maintain level and enables or disables PWM modulation as specified. The frequency and duty cycle of the PWM modulation may be set at any time by the user. It will be appreciated that additional time/power states can also be supported.

Another important factor is impedance matching of the generator to the plasma cavity. The cavity will exhibit two states. In the first state, prior to plasma ignition, there is virtually no load in the cavity, so it will present a high impedance, resulting in a poor return loss. If the amount of reflected power is significant enough, there may not be enough energy delivered to initiate the plasma. In the second state, after the plasma is struck, the microwave electromagnetic field increases the energy state of the gas atoms resulting in high microwave absorption. Consequently, the impedance of the cavity in this state is quite low and can present a good match at certain frequencies, depending also on the geometry of the applicator cavity. Therefore, the applicator has two general impedance states.

As disclosed herein, an important capability of the invention is the ability to measure return loss sweeping across the band, and to identify the operating frequency where the best impedance match, and therefore maximum energy transfer occurs. For plasma applications, the system provides a two phase process to optimally tune the generator to the plasma apparatus. In the first phase, a "Best Frequency" operation is performed to select the optimal frequency for the ignition pulse. The higher power ignition pulse then occurs. In the second phase, after the plasma has been initiated the impedance will have changed significantly. The microwave power is then reduced to the maintenance level. The system can automatically determine the optimal frequency by sweeping up and down in frequency in a bounded range while reading the return loss. The sweep is limited to a bounded range to prevent an excess of reflected power that could cause the plasma to extinguish. The system can also automatically determine the power level necessary to maintain the plasma by incrementally reducing power until the plasma extinguishes. It will be appreciated that the optimum power and frequency settings can be stored for future use, so the tuning operation is not necessary.

Therefore, the present disclosure has provided systems, methods, and/or apparatus for the generation, control, monitoring, and operation of high powered microwave generation utilizing solid state components. It should be appreciated that the disclosure provides for aspects and embodiments that may be independent of one another or be used in any combination, including sub-components therefore. Furthermore, variations obvious to those skilled in the art are to be considered a part of the present disclosure.

What is claimed is:

1. A method of exciting of a gas plasma generator or other gas plasma device, comprising:
    a solid-state microwave generator producing a fast, high power microwave ignition pulse; and
    reducing power to a defined maintenance level;
    wherein a frequency and power level of the microwave ignition pulse and the maintenance level may be set by a user or may be automatically determined; and
    pulsing microwave energy to control the gas plasma.

2. The method of claim 1, further comprising determining if the gas plasma was struck by monitoring return loss or load impedance to detect an impedance change.

3. The method of claim 2, further comprising repeating the ignition and reduction of power to the defined maintenance level.

4. The method of claim 2, wherein the determining step comprises determining if there was an increase in the monitored return loss.

5. The method of claim 4, further comprising, if the plasma is not initiated, increasing power, and repeating the high-power microwave ignition pulse.

6. A method for tuning the generation of plasma with a high-power microwave system, the method comprising:
    automatically identifying and operating the high-power microwave system at an optimal frequency for an ignition pulse;
    igniting the plasma via the ignition pulse; after the plasma has been initiated, determining the impedance level; and
    reducing microwave power to a defined maintenance level after the plasma has been initiated.

7. The method of claim 6, further comprising determining an optimal frequency by sweeping up and down in frequency while reading a return loss and impedance.

8. The method of claim 7, wherein the sweeping up and down in frequency is done in a bounded range.

9. The method of claim 8, wherein the bounded range prevents reflected power to mitigate extinguishing of the plasma.

10. The method of claim 7, further comprising automatically determining a power level needed to maintain the plasma.

11. The method of claim 10, wherein the step of automatically determining the power level needed to maintain the plasma comprises incrementally reducing power until the return loss reaches a limiting value or the plasma extinguishes.

12. The method of claim 11, further comprising storing optimum power and frequency settings for future use.

13. A system of exciting of a gas plasma generator or other gas plasma device using application of high speed pulsed or pulse width modulated microwave energy in order to provide control of the plasma, the frequency and duty cycle of the pulse mode is adjustable by the user, or automatically adjusted based on impedance measurement or readings from sensors incorporated into the plasma apparatus, where a microwave generator's exciter is keyed by a pulse width signal thus allowing very high speed pulse modulation.

14. A system of measuring return loss or load impedance by sweeping microwave energy across a band while measuring return loss or impedance, and in the process identifying the operating frequency or frequencies where the best impedance match occurs, and providing a two phase process to optimally tune the microwave generator to the plasma apparatus, wherein the first phase, a Best Frequency frequency sweep operation is performed to select the optimal frequency for the ignition pulse, and in the second phase, after the plasma has been initiated and the microwave power and the plasma generator impedance has changed significantly, the power is reduced to a level sufficient to maintain the plasma, and the system automatically determines the new frequency having the best impedance match by sweeping up and down in frequency in a bounded range to prevent an excess of reflected power that could cause the plasma to extinguish, while measuring the return loss or impedance of the plasma apparatus; and further wherein an optimum power and frequency settings for each phase can be stored for future use, so the tuning operation may not be required.

* * * * *